United States Patent
Park et al.

(10) Patent No.: US 12,426,340 B2
(45) Date of Patent: Sep. 23, 2025

(54) SEMICONDUCTOR MEMORY DEVICE

(71) Applicant: SAMSUNG ELECTRONICS CO., LTD., Suwon-si (KR)

(72) Inventors: Taejin Park, Yongin-si (KR); Kiseok Lee, Hwaseong-si (KR); Hui-Jung Kim, Seongnam-si (KR); Yoosang Hwang, Yongin-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 705 days.

(21) Appl. No.: 17/873,242

(22) Filed: Jul. 26, 2022

(65) Prior Publication Data

US 2023/0044856 A1 Feb. 9, 2023

(30) Foreign Application Priority Data

Aug. 5, 2021 (KR) .................. 10-2021-0103301

(51) Int. Cl.
| | |
|---|---|
| *G11C 5/06* | (2006.01) |
| *H01L 21/02* | (2006.01) |
| *H01L 21/76* | (2006.01) |
| *H01L 21/762* | (2006.01) |
| *H01L 21/768* | (2006.01) |
| *H10D 64/27* | (2025.01) |

(52) U.S. Cl.
CPC ........... *H10D 64/513* (2025.01); *G11C 5/063* (2013.01); *H01L 21/02112* (2013.01); *H01L 21/76224* (2013.01); *H01L 21/76829* (2013.01)

(58) Field of Classification Search
CPC .............. G11C 5/063; H01L 21/02112; H01L 21/76224; H01L 21/76829; H10D 64/513
USPC ........................................................ 257/330
See application file for complete search history.

(56) References Cited

U.S. PATENT DOCUMENTS

| | | |
|---|---|---|
| 7,833,902 B2 | 11/2010 | Lee |
| 9,209,241 B2 | 12/2015 | Kim et al. |
| 9,490,256 B2 | 11/2016 | Kim et al. |
| 10,074,656 B1 | 9/2018 | Wang et al. |
| 10,490,446 B2 | 11/2019 | Park et al. |
| 10,916,549 B2 | 2/2021 | Son et al. |

(Continued)

FOREIGN PATENT DOCUMENTS

| | | |
|---|---|---|
| KR | 10-0781547 B1 | 12/2007 |
| KR | 10-2017-0003830 A | 1/2017 |
| KR | 10-2018-0018239 A | 2/2018 |

*Primary Examiner* — Monica D Harrison
(74) *Attorney, Agent, or Firm* — Muir Patent Law, PLLC

(57) ABSTRACT

A semiconductor memory device including a substrate including an active pattern that includes a first source/drain region and a second source/drain region; an insulating layer on the substrate; a line structure on the insulating layer and extending in a first direction to cross the active pattern, the line structure penetrating the insulating layer on the first source/drain region and including a bit line electrically connected to the first source/drain region; and a contact spaced apart from the line structure and electrically connected to the second source/drain region, wherein the bit line includes a first portion vertically overlapped with the first source/drain region; and a second portion vertically overlapped with the insulating layer, and wherein a lowermost level of a top surface of the first portion of the bit line is at a level lower than a lowermost level of a top surface of the second portion of the bit line.

20 Claims, 53 Drawing Sheets

(56) References Cited

U.S. PATENT DOCUMENTS

| | | |
|---|---|---|
| 2007/0190773 A1 | 8/2007 | Baars et al. |
| 2017/0170234 A1* | 6/2017 | Lee .................... G11C 11/1659 |
| 2018/0301456 A1 | 10/2018 | Cho et al. |
| 2020/0402804 A1 | 12/2020 | Kim et al. |
| 2021/0035613 A1 | 2/2021 | Park et al. |
| 2021/0098460 A1 | 4/2021 | Lee et al. |
| 2021/0134808 A1 | 5/2021 | Kim et al. |

* cited by examiner

SEMICONDUCTOR MEMORY DEVICE

CROSS-REFERENCE TO RELATED APPLICATION

This U.S. non-provisional patent application claims priority under 35 U.S.C. § 119 to Korean Patent Application No. 10-2021-0103301, filed on Aug. 5, 2021, in the Korean Intellectual Property Office, the entire contents of which are hereby incorporated by reference.

BACKGROUND

1. Field

Embodiments relate to a semiconductor memory device.

2. Description of the Related Art

Due to their small-size, multifunctionality, and/or low-cost characteristics, semiconductor devices are considered important elements in the electronic industry. A memory device, which is one of the semiconductor devices, may be configured to store logical data. As the electronic industry advances, there is an increasing demand for semiconductor devices with improved characteristics.

SUMMARY

The embodiments may be realized by providing a semiconductor memory device including a substrate including an active pattern that includes a first source/drain region and a second source/drain region; an insulating layer on the substrate; a line structure on the insulating layer and extending in a first direction to cross the active pattern, the line structure penetrating the insulating layer on the first source/drain region and including a bit line electrically connected to the first source/drain region; and a contact spaced apart from the line structure and electrically connected to the second source/drain region, wherein the bit line includes a first portion vertically overlapped with the first source/drain region; and a second portion vertically overlapped with the insulating layer, and wherein a lowermost level of a top surface of the first portion of the bit line is at a level lower than a lowermost level of a top surface of the second portion of the bit line.

The embodiments may be realized by providing a semiconductor memory device including a substrate including a first active pattern, the first active pattern including a first source/drain region and a second source/drain region; a device isolation layer on the substrate and filling a first trench defining the first active pattern; an insulating layer on the device isolation layer; a line structure on the insulating layer, crossing the first active pattern, and extending in a first direction, the line structure including a conductive pattern penetrating the insulating layer and being coupled to the first source/drain region, a barrier pattern on the conductive pattern, and a bit line on the barrier pattern; a gate electrode extending in a second direction, crossing the first active pattern, and crossing a region between the first and second source/drain regions; a spacer on a side surface of the line structure; and a contact spaced apart from the line structure by the spacer and electrically connected to the second source/drain region, wherein each of the bit line and the barrier pattern includes a first portion vertically overlapped with the first source/drain region; and a second portion vertically overlapped with the insulating layer, and wherein a largest width of the first portion of the bit line is larger than a largest width of the second portion of the bit line.

The embodiments may be realized by providing a semiconductor memory device including a substrate including an active pattern having a long axis in a first direction, the active pattern including a first source/drain region and a pair of second source/drain regions, the pair of second source/drain regions being spaced apart from each other in the first direction with the first source/drain region interposed therebetween; a device isolation layer on the substrate and filling a first trench defining the active pattern; a pair of gate electrodes extending in a second direction and crossing the active pattern, each gate electrode of the pair of gate electrodes being in a second trench between the first and second source/drain regions; a gate dielectric layer between each of the pair of gate electrodes and the active pattern; a gate capping layer on each of the pair of gate electrodes and filling the second trench; an insulating layer on the substrate; a line structure on the insulating layer, crossing the active pattern, and extending in a third direction, the line structure including a conductive pattern penetrating the insulating layer and being coupled to the first source/drain region, a bit line on the conductive pattern, and a barrier pattern between the bit line and the conductive pattern; a pair of spacers on opposite side surfaces of the line structure, respectively; contacts respectively coupled to the pair of second source/drain regions and being spaced apart from the line structure by the pair of spacers; landing pads on the contacts; first electrodes on the landing pads, respectively; a second electrode on the first electrodes; and a dielectric layer between the first electrodes and the second electrode, wherein the bit line of the line structure includes a first portion vertically overlapped with the first source/drain region; and a second portion vertically overlapped with the insulating layer, and wherein a lowermost level of a top surface of the first portion of the bit line is at a level lower than a lowermost level of a top surface of the second portion of the bit line.

BRIEF DESCRIPTION OF THE DRAWINGS

Features will be apparent to those of skill in the art by describing in detail exemplary embodiments with reference to the attached drawings in which.

DETAILED DESCRIPTION

Figure 1:
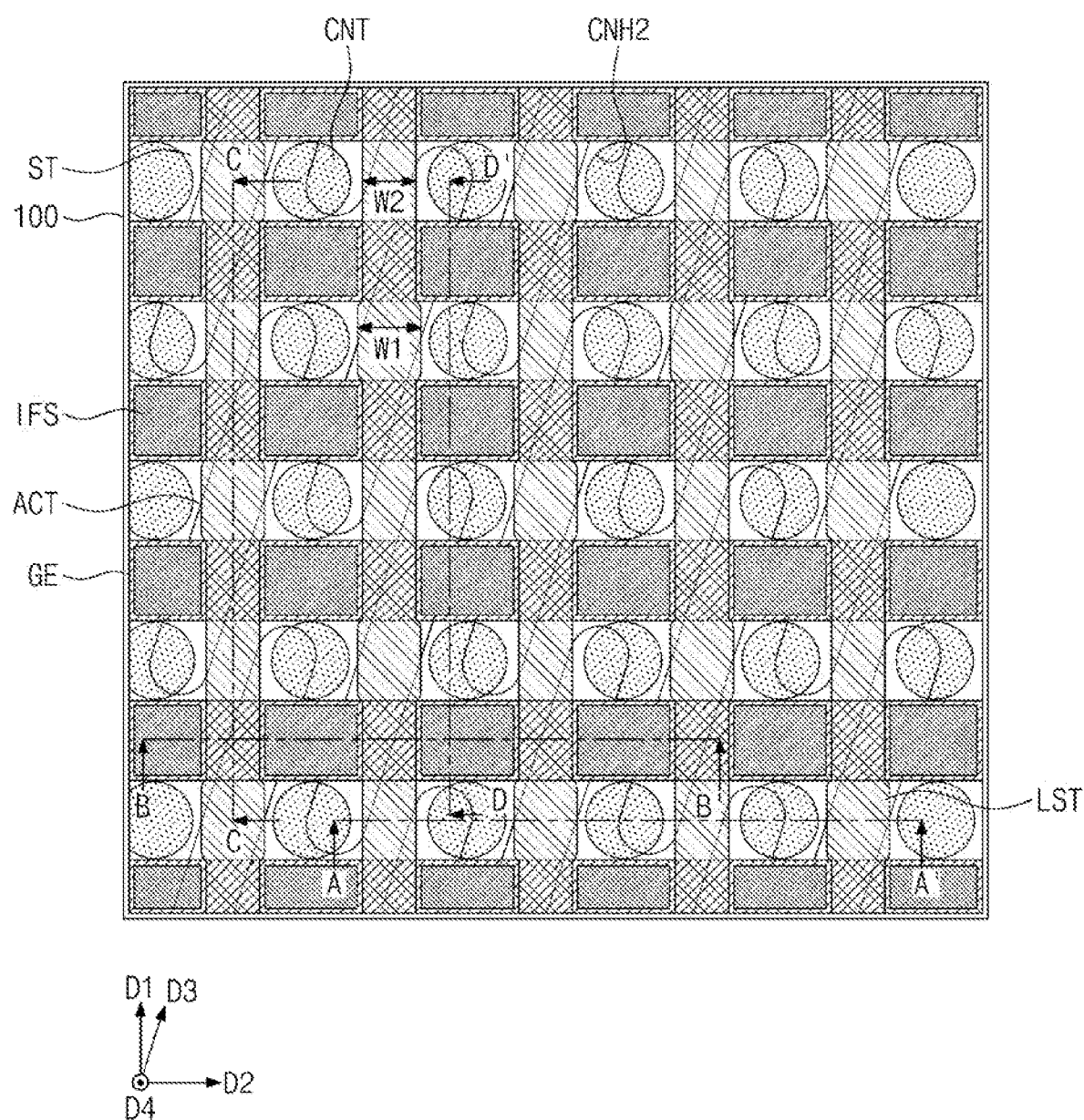
FIG. 1 is a plan view of a semiconductor device according to an embodiment.

FIG. 1 is a plan view of a semiconductor device according to an embodiment. FIGS. 2A, 2B, 2C, and 2D are sectional views taken along lines A-A', B-B', C-C', and D-D', respectively, of FIG. 1. FIG. 3 is an enlarged sectional view of a portion 'M' of FIG. 2A.

Referring to FIGS. 1 and 2A to 2D, a device isolation layer ST may be on a substrate 100 and may define active patterns ACT. In an implementation, the substrate 100 may be a semiconductor substrate that is formed of silicon, germanium, or silicon-germanium. The device isolation layer ST may include a silicon oxide layer. As used herein, the term "or" is not an exclusive term, e.g., "A or B" would include A, B, or A and B.

The active patterns ACT may be formed by patterning an upper portion of the substrate 100. Each of the active patterns ACT may extend in a third direction D3, which is parallel to a top surface of the substrate 100. In an implementation, each of the active patterns ACT may have a long axis parallel to the third direction D3. The active patterns ACT may be two-dimensionally arranged in a first direction D1 and a second direction D2. The active patterns ACT may be spaced apart from each other in the third direction D3.

Each of the active patterns ACT may have a decreasing width, in a direction perpendicular to the top surface of the substrate 100 (e.g., in a vertical or fourth direction D4). In an implementation, each of the active patterns ACT may have a decreasing width, with increasing distance from a bottom surface of the substrate 100.

First and second trenches TR1 and TR2 may be defined between the active patterns ACT. The device isolation layer ST may fill the first and second trenches TR1 and TR2 between the active patterns ACT. The first trench TR1 may be defined between a pair of the active patterns ACT, which are adjacent to each other in the second direction D2. The second trench TR2 may be defined between a pair of the active patterns ACT, which are adjacent to each other in the third direction D3.

A distance between the pair of the active patterns ACT, which are adjacent to each other in the second direction D2, may be smaller than a distance between the pair of the active patterns ACT, which are adjacent to each other in the third direction D3. In an implementation, the second trench TR2 may be deeper than the first trench TR1. In an implementation, a bottom surface of the second trench TR2 may be lower than a bottom surface of the first trench TR1 (e.g., see FIG. 2B).

An upper portion of each of the active patterns ACT may include a first source/drain region SD1 and a pair of second source/drain regions SD2. The first source/drain region SD1 may be between the second source/drain regions of the pair of second source/drain regions SD2. In an implementation, when viewed in a plan view, the second source/drain region SD2, the first source/drain region SD1, and the second source/drain region SD2 may be sequentially arranged in the third direction D3.

Figure 2A:
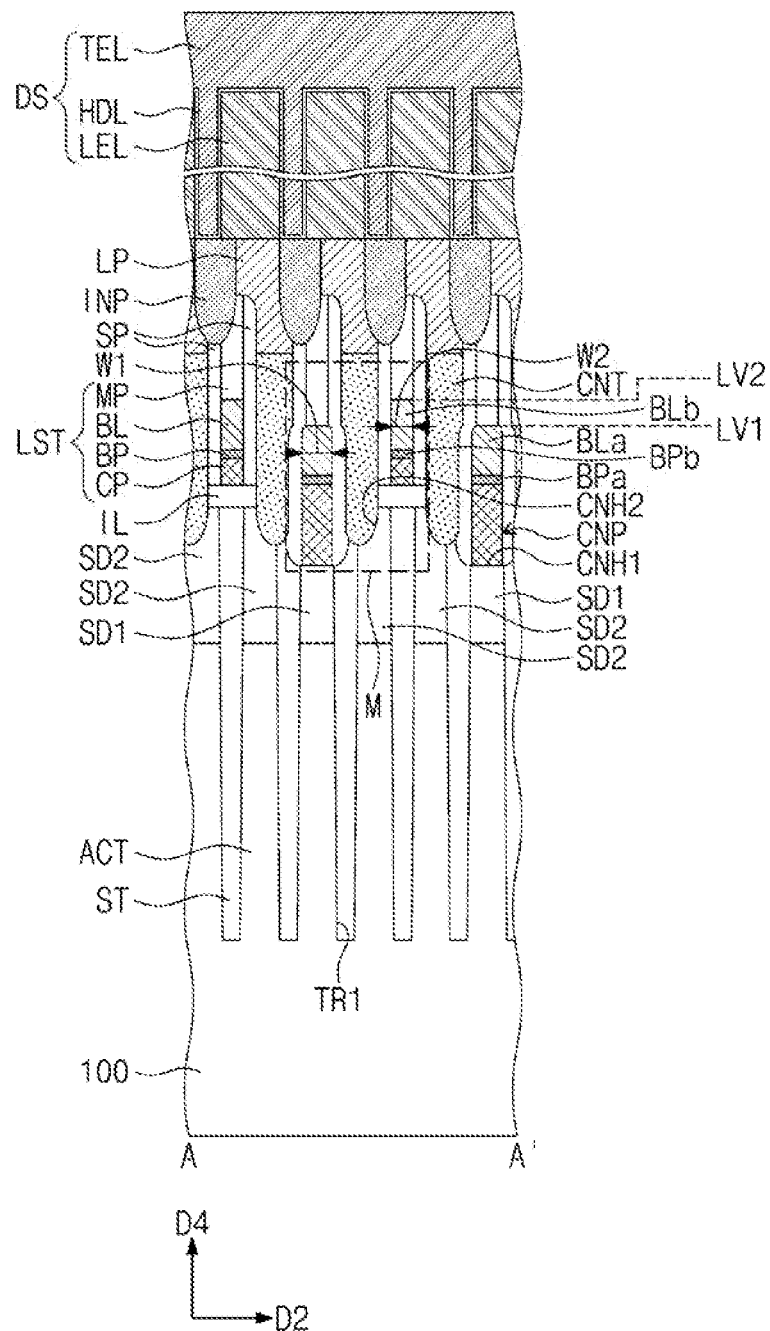
FIGS. 2A, 2B, 2C, and 2D are sectional views taken along lines A-A', B-B', C-C', and D-D', respectively, of FIG. 1.
Figure 2B:
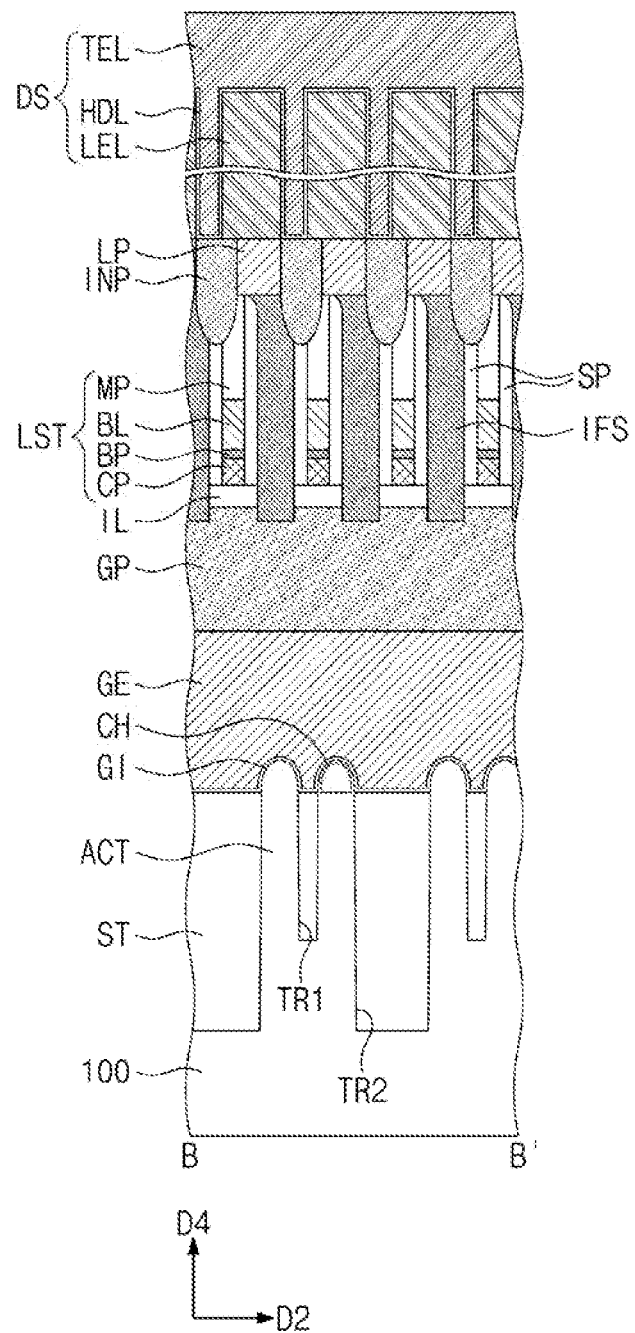
Figure 2C:
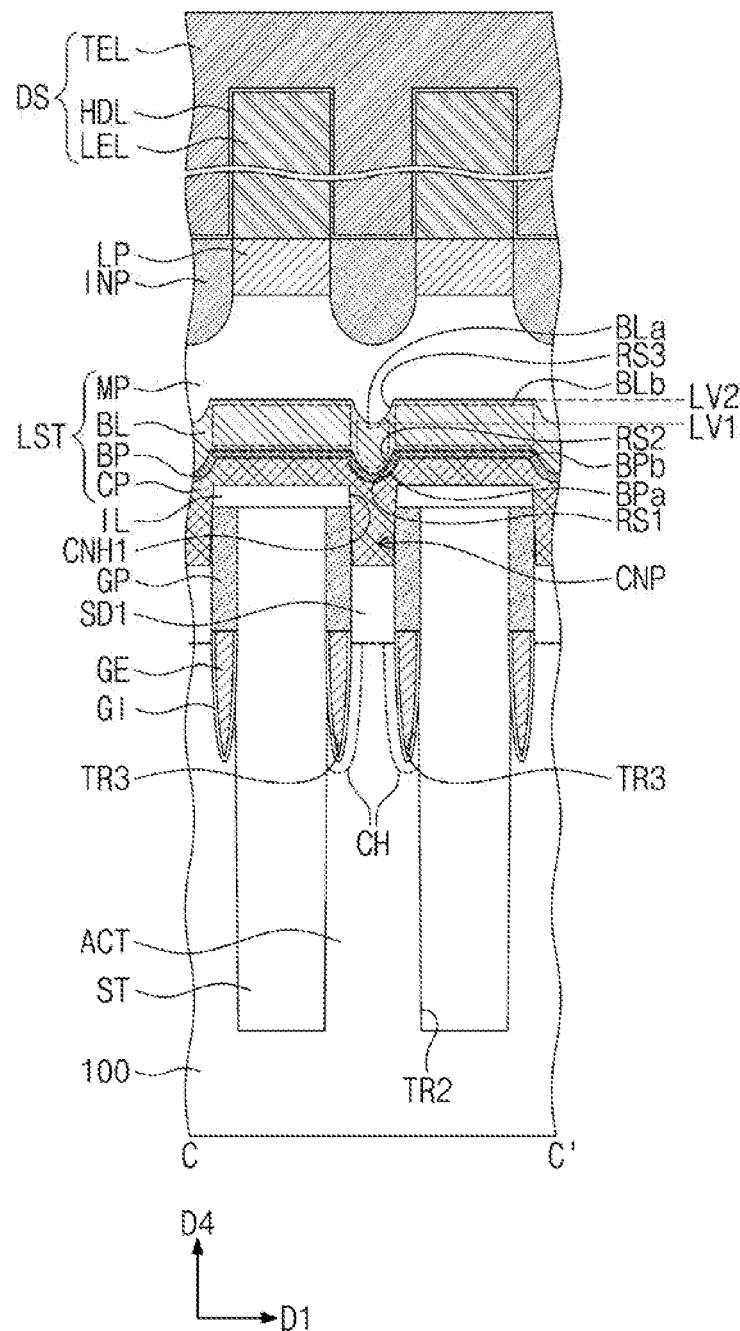
Figure 2D:
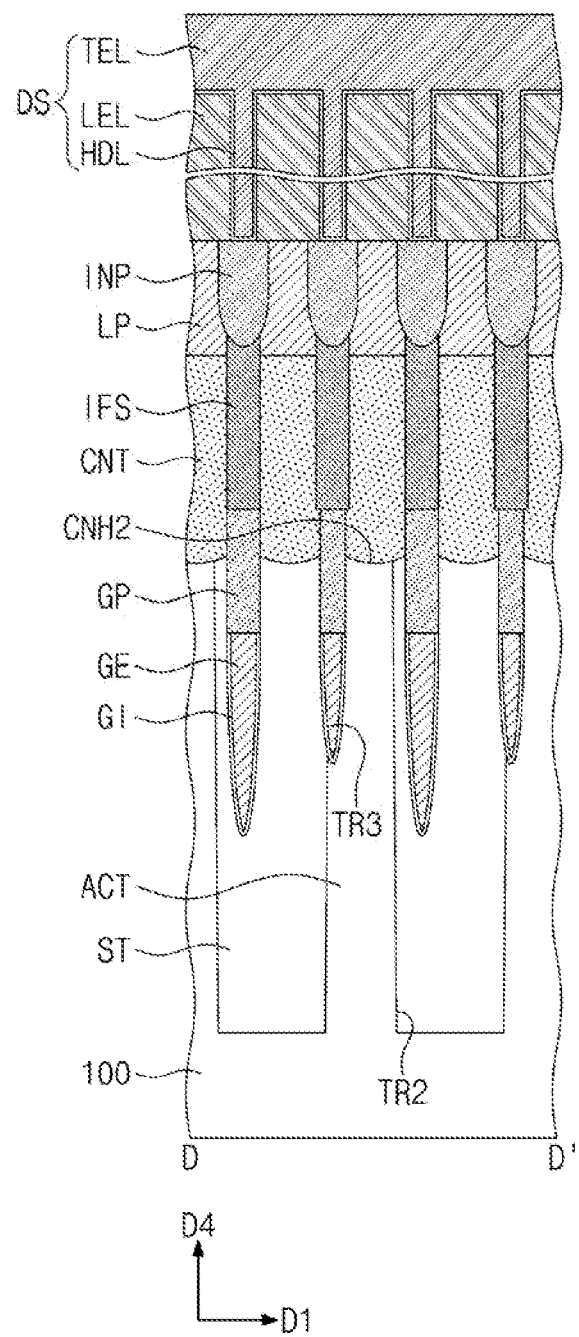
Figure 3:
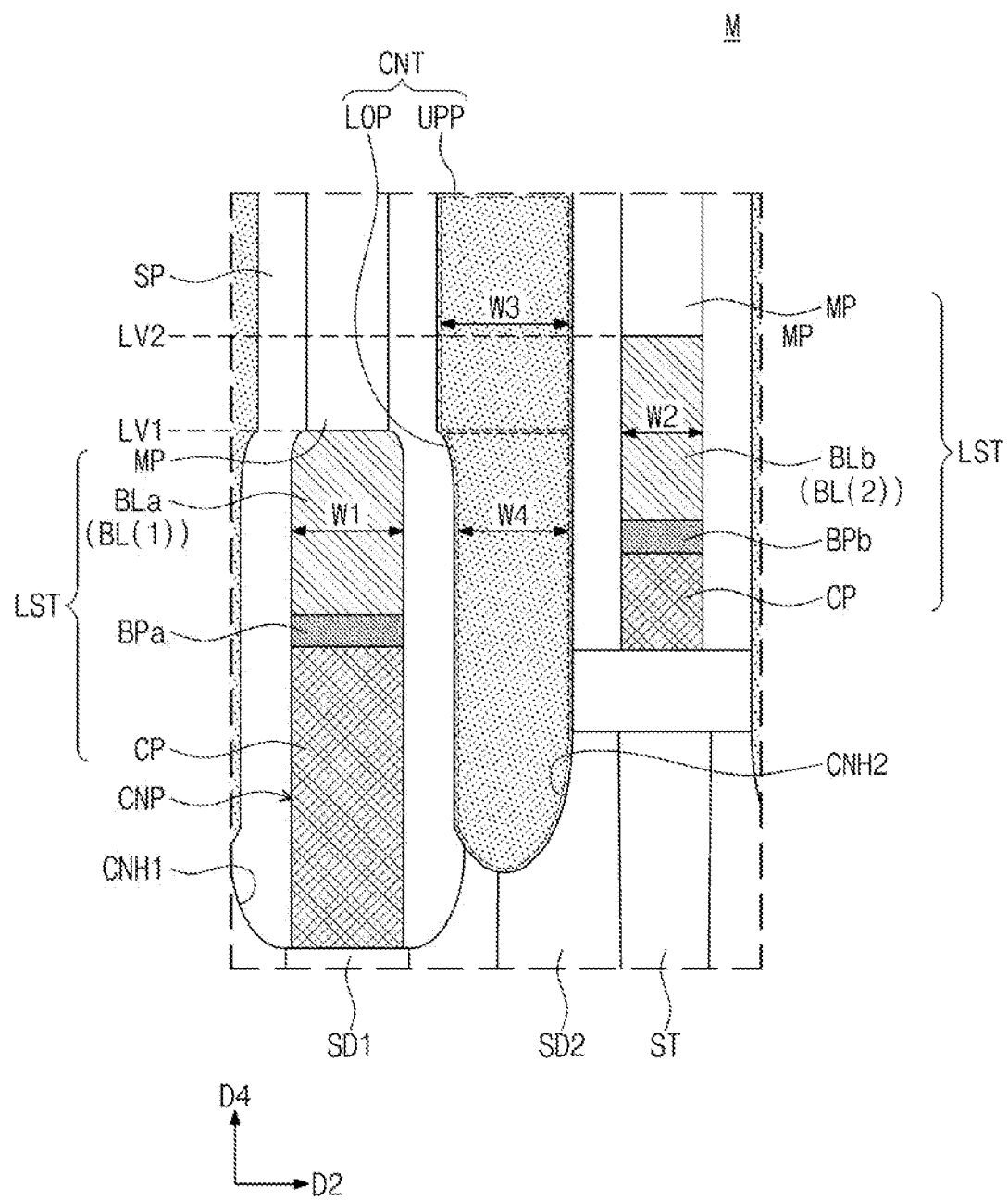
FIG. 3 is an enlarged sectional view of a portion 'M' of FIG. 2A.
Figure 4:
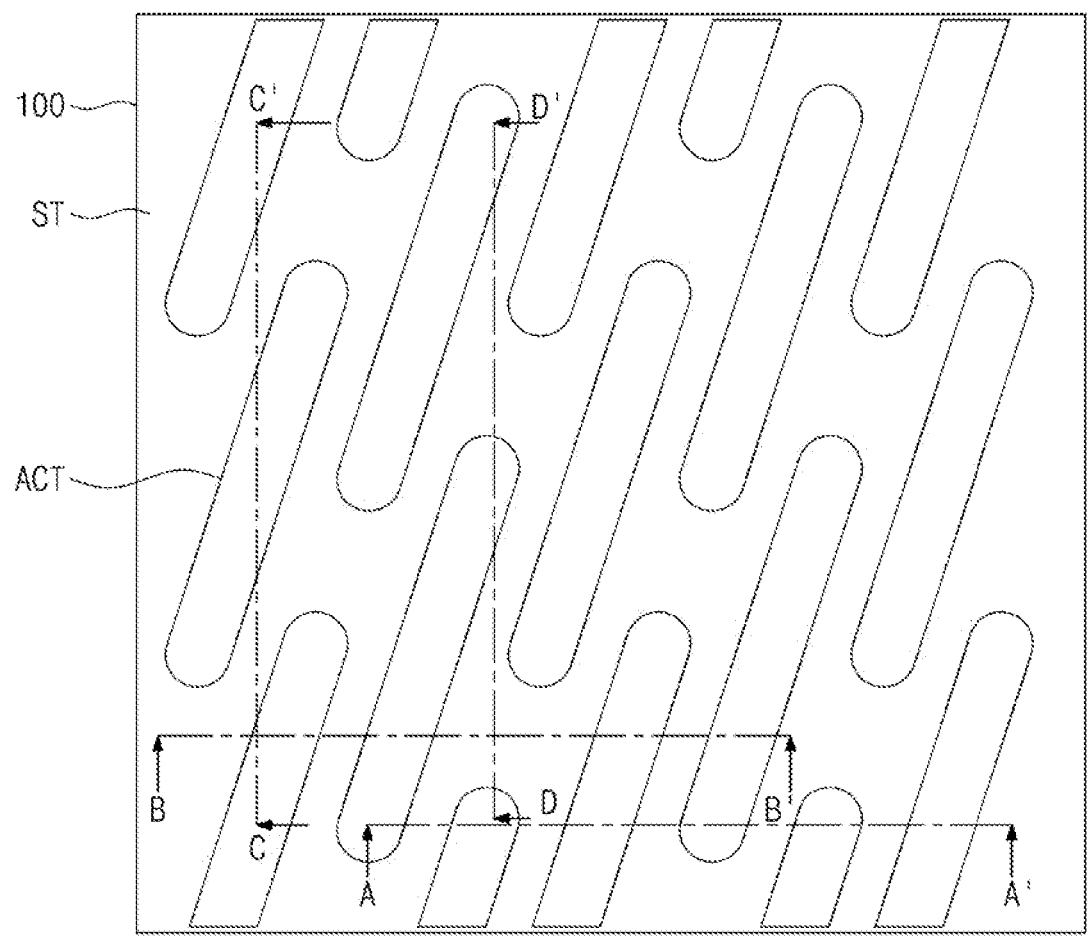
FIGS. 4, 6, 8, 10, 12, 14, 16, and 18 are plan views of stages in a method of fabricating a semiconductor device according to an embodiment.
Figure 4:
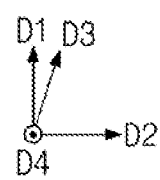
Figure 5A:
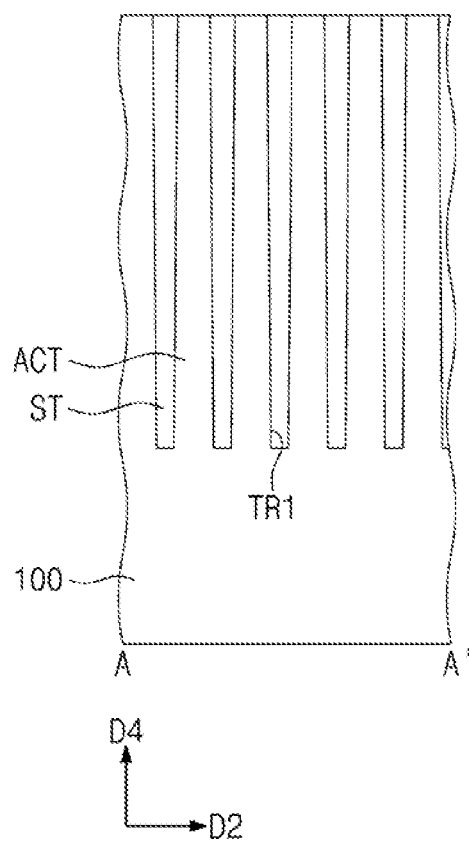
FIGS. 5A, 7A, 9A, 11A, 13A, 15A, 17A, and 19A are sectional views taken along lines A-A' of FIGS. 4, 6, 8, 10, 12, 14, 16, and 18, respectively.
Figure 5B:
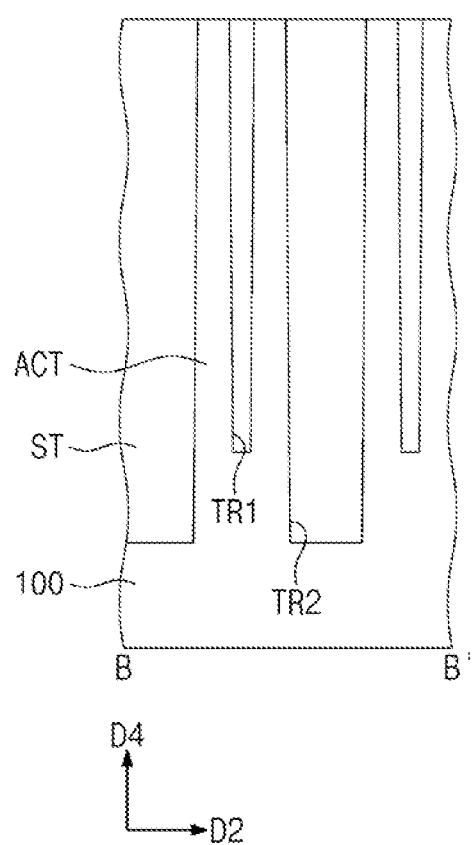
FIGS. 5B, 7B, 9B, 11B, 13B, 15B, 17B, and 19B are sectional views taken along lines B-B' of FIGS. 4, 6, 8, 10, 12, 14, 16, and 18, respectively.
Figure 5C:
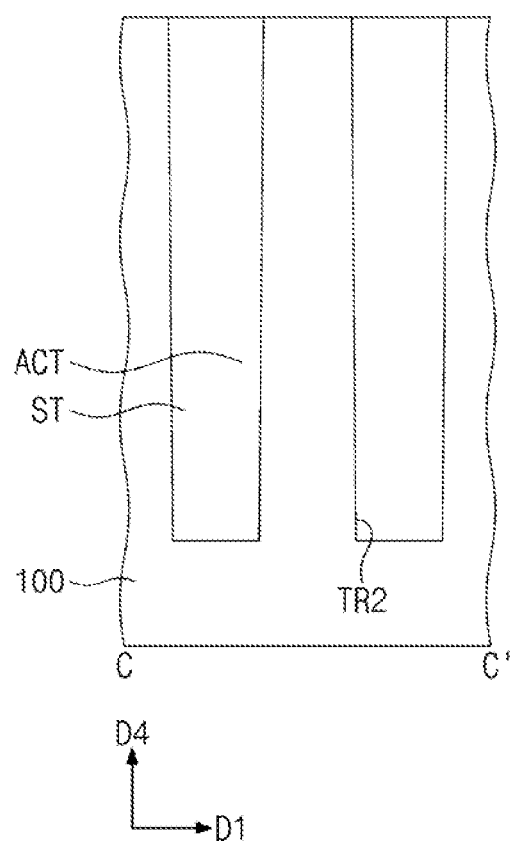
FIGS. 5C, 7C, 9C, 11C, 13C, 15C, 17C, and 19C are sectional views taken along lines C-C' of FIGS. 4, 6, 8, 10, 12, 14, 16, and 18, respectively.
Figure 5D:
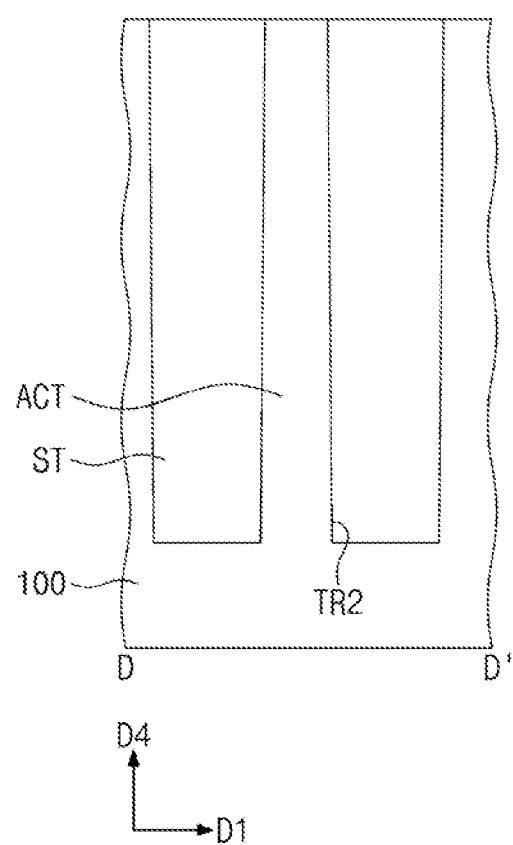
FIGS. 5D, 7D, 9D, 11D, 13D, 15D, 17D, and 19D are sectional views taken along lines D-D' of FIGS. 4, 6, 8, 10, 12, 14, 16, and 18, respectively.
Figure 6:
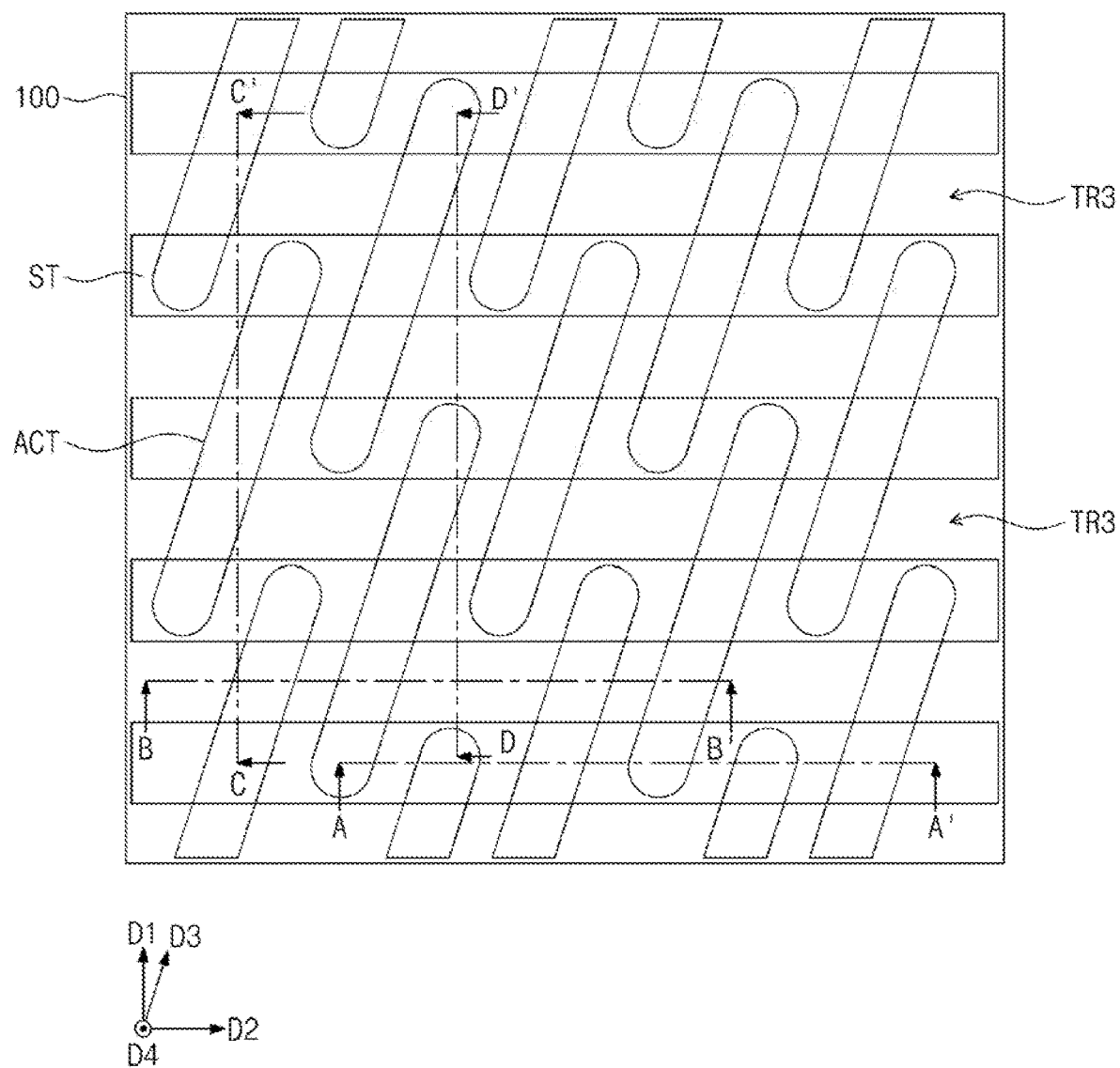
Figure 7A:
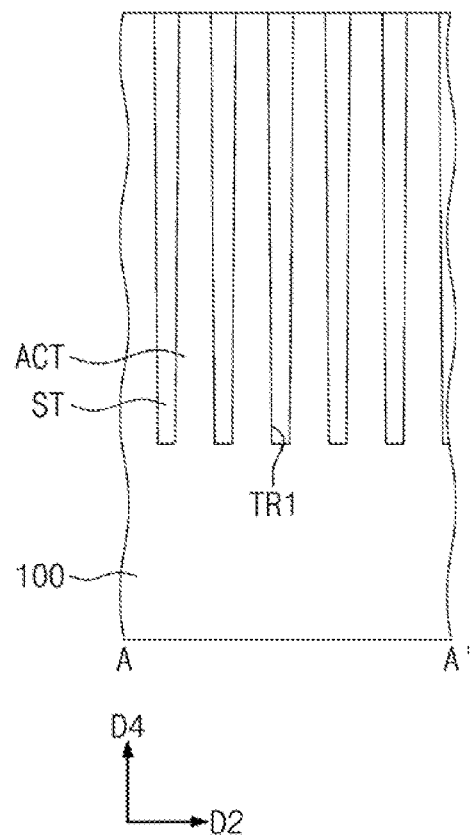
Figure 7B:
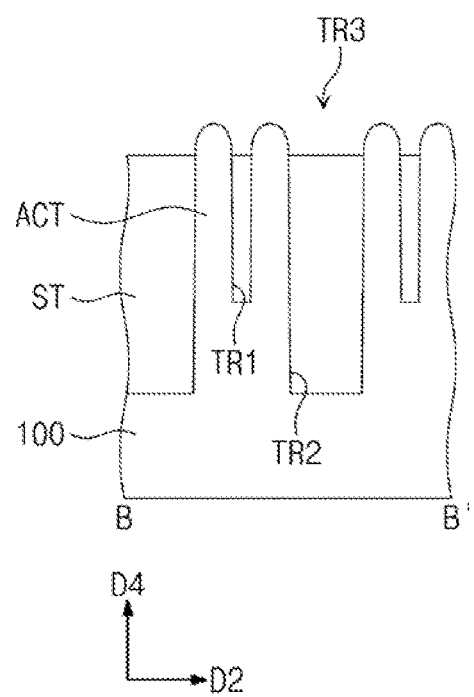
Figure 7C:
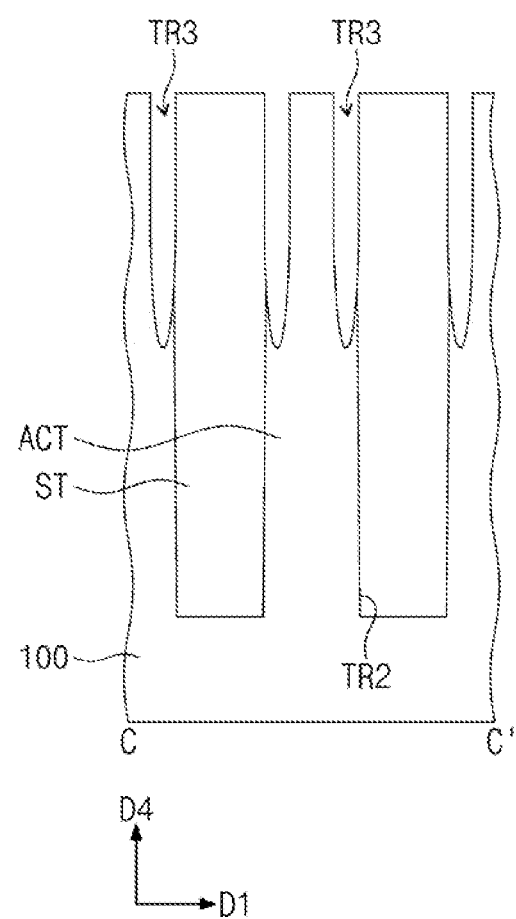
Figure 7D:
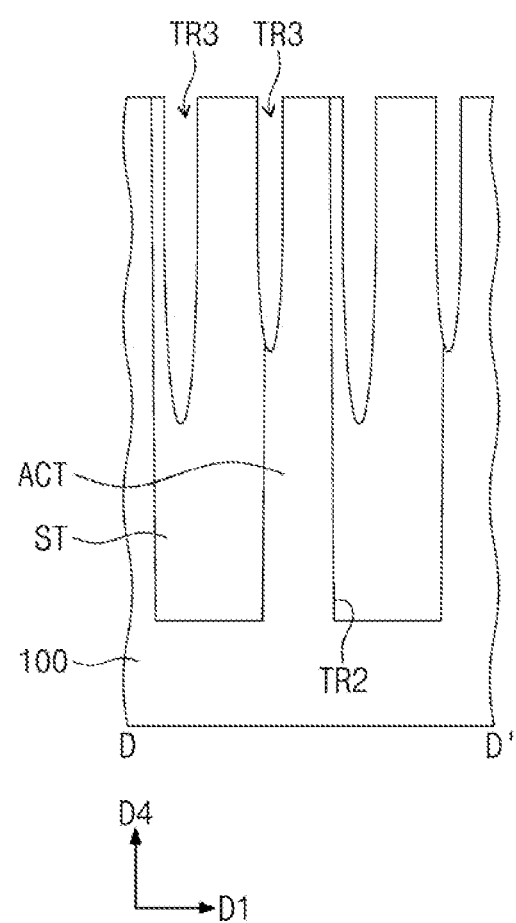
Figure 8:
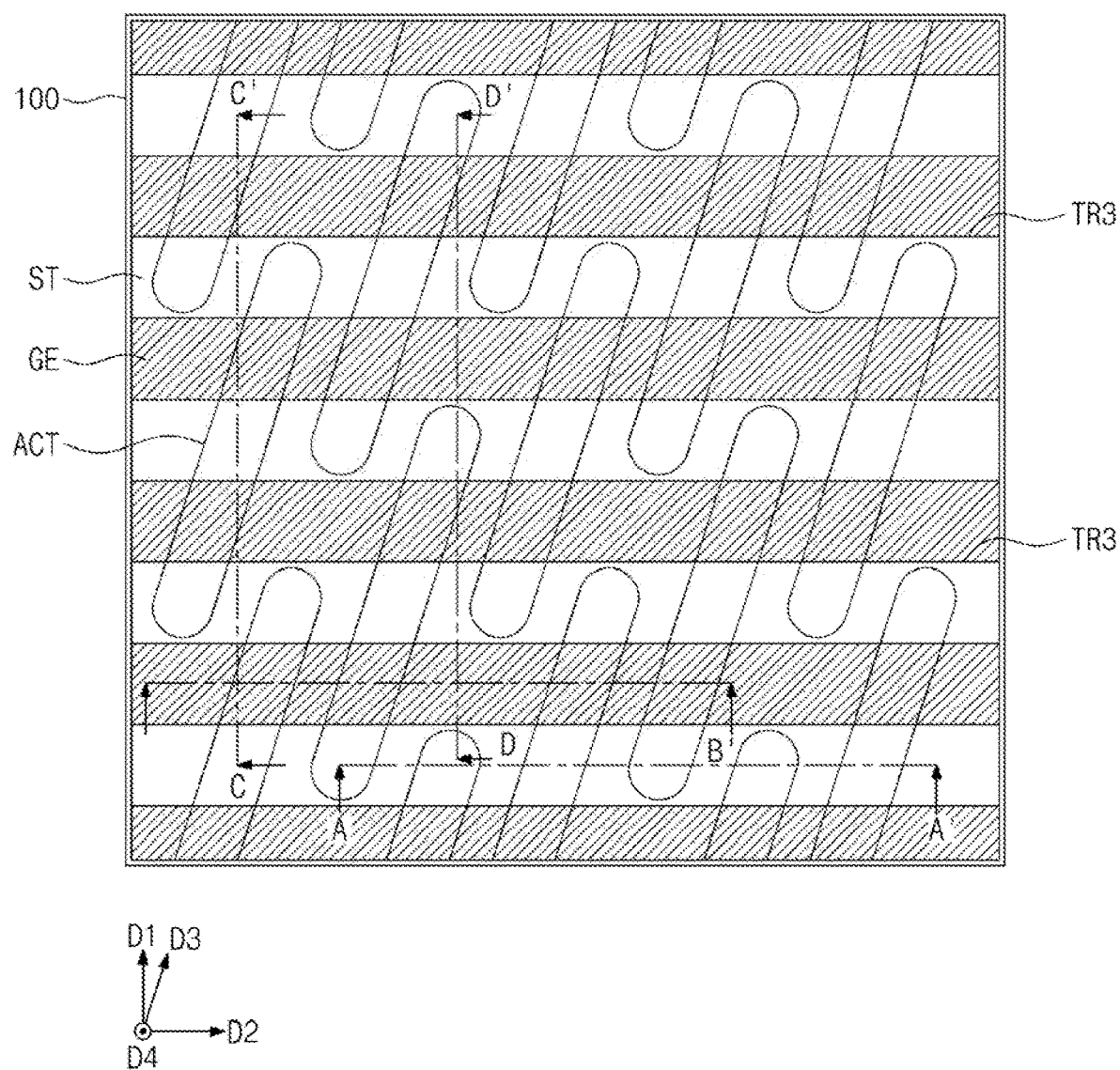
Figure 9A:
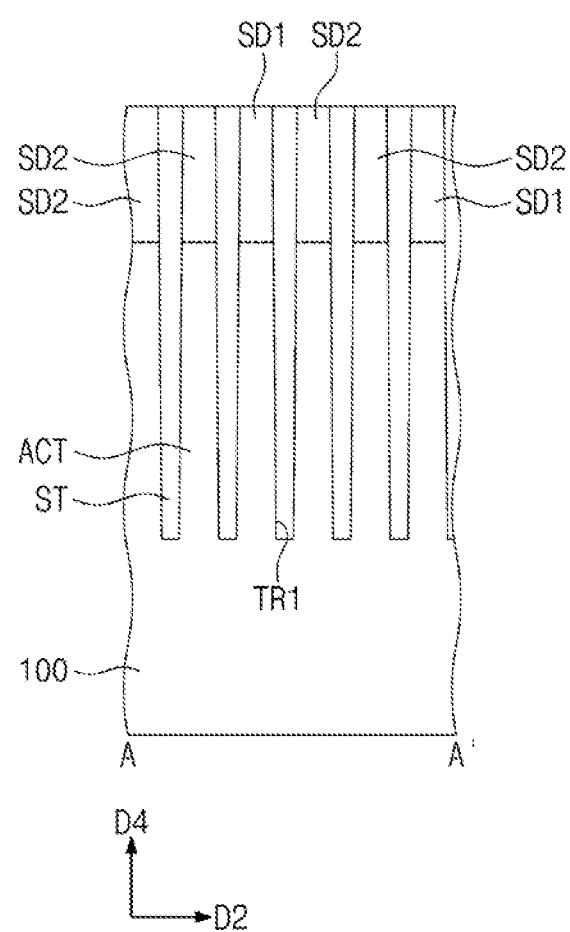
Figure 9B:
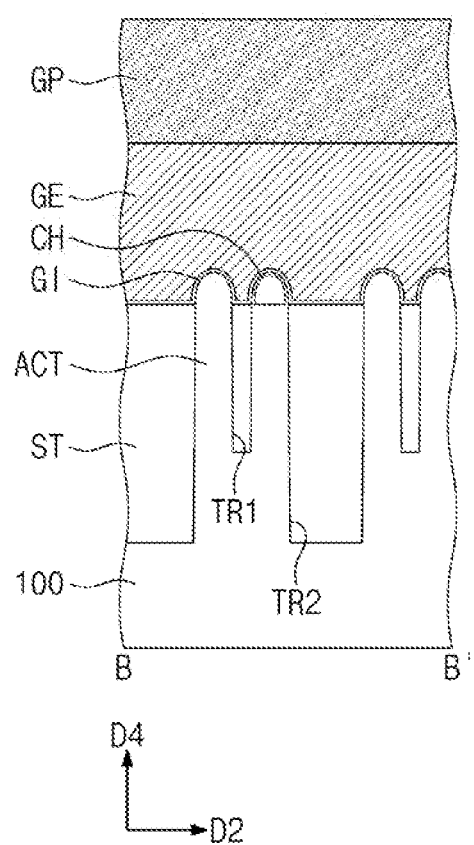
Figure 9C:
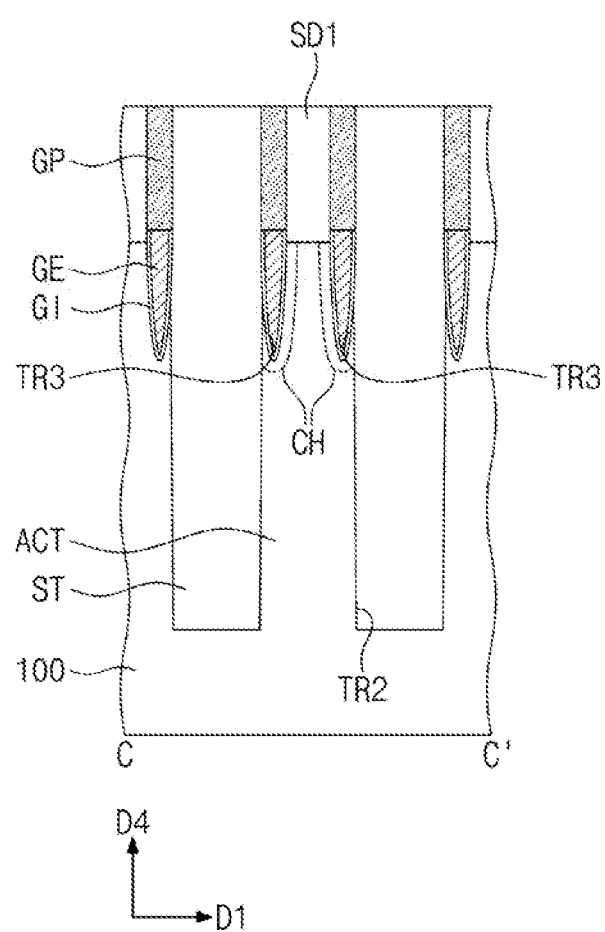
Figure 9D:
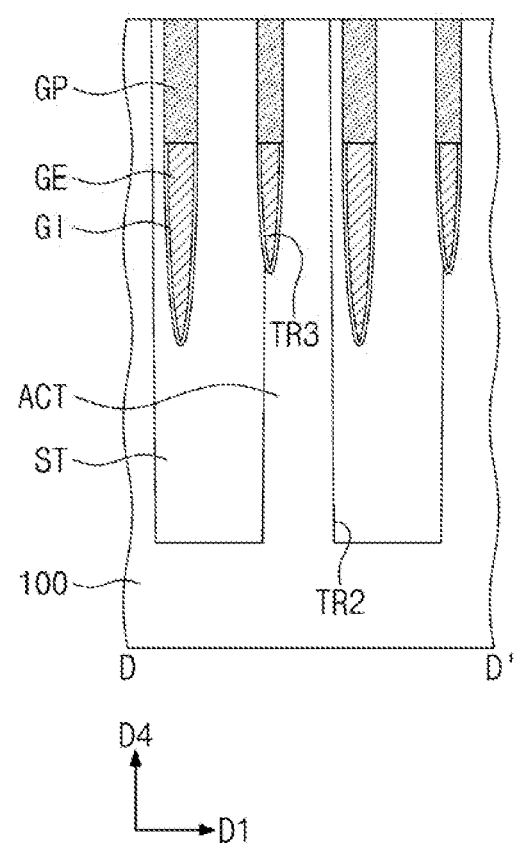
Figure 10:
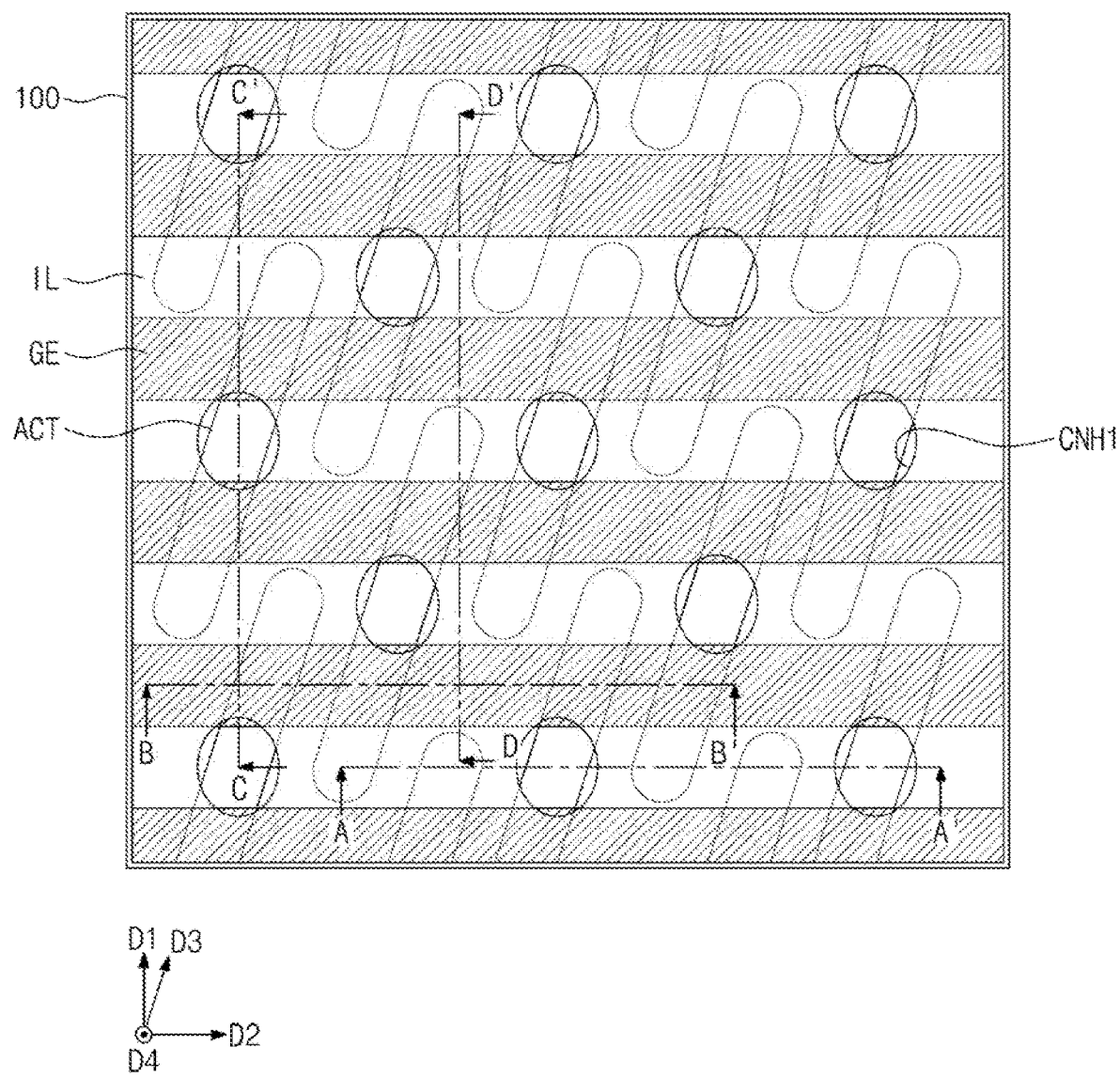
Figure 11A:
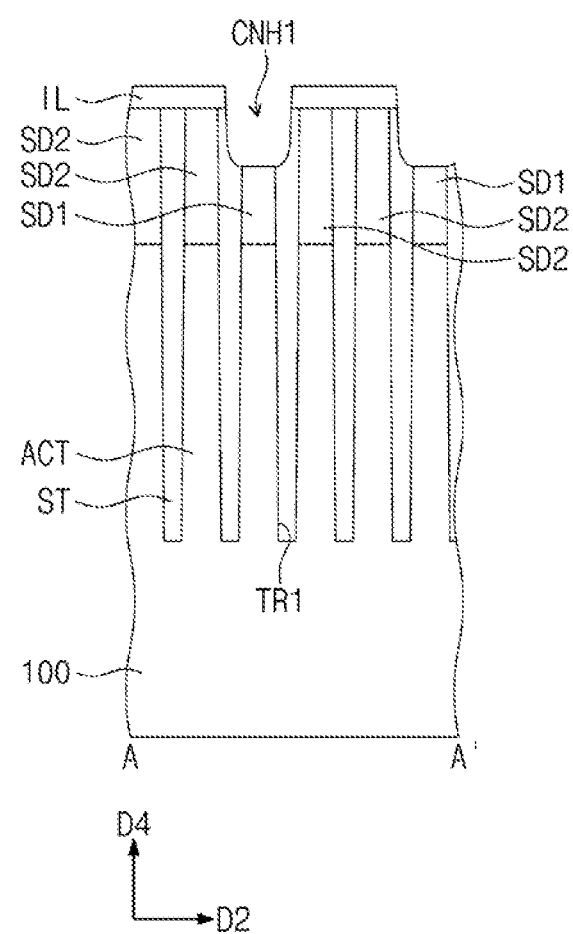
Figure 11B:
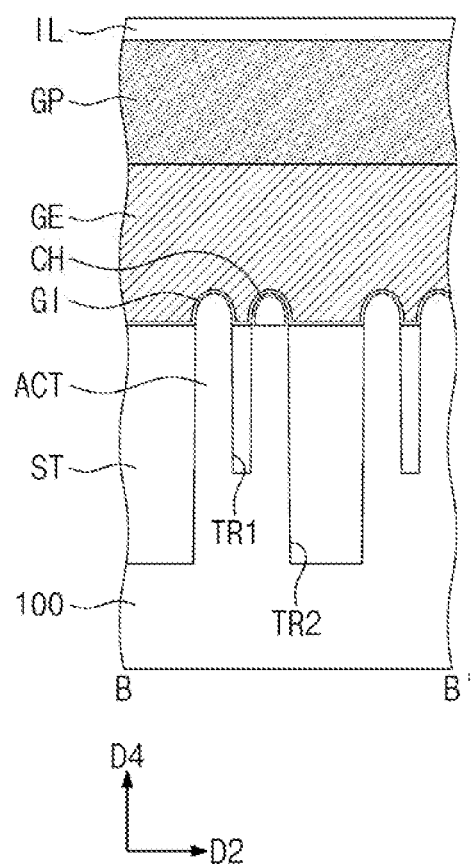
Figure 11C:
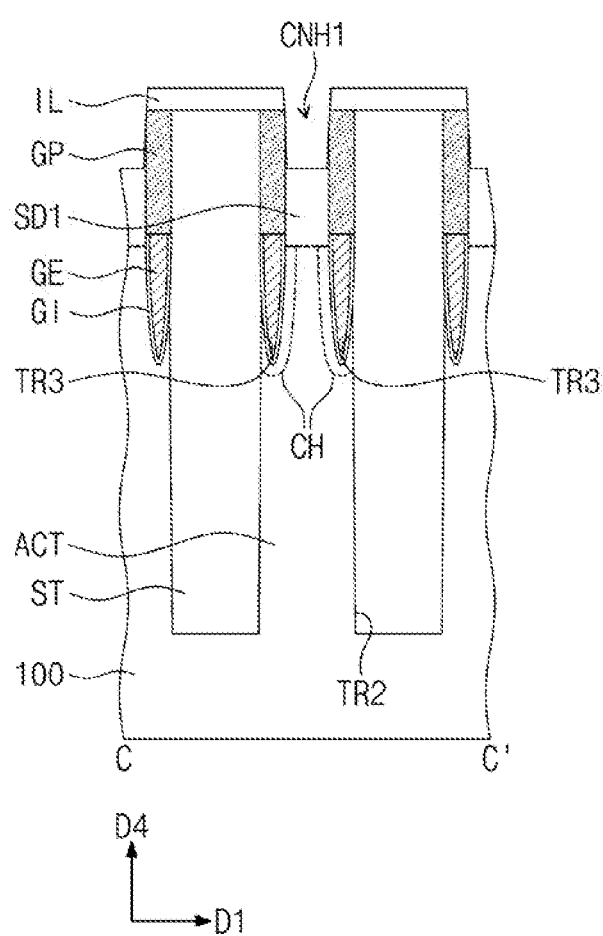
Figure 11D:
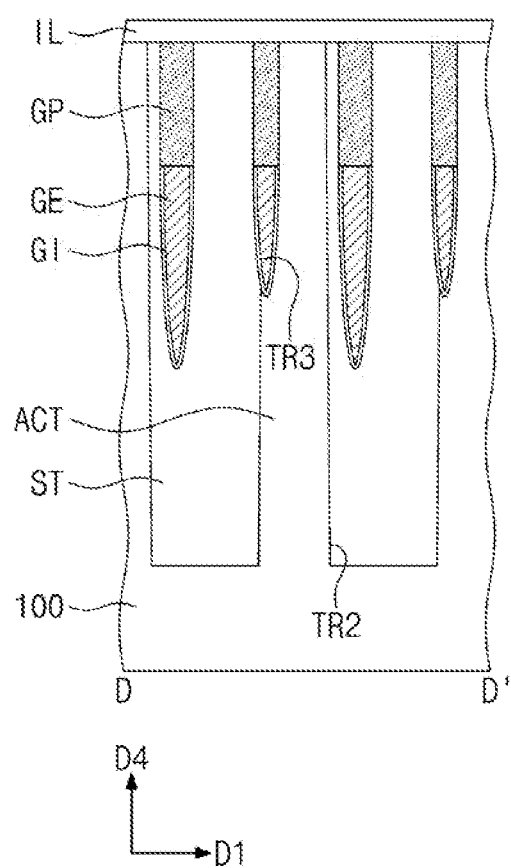
Figure 12:
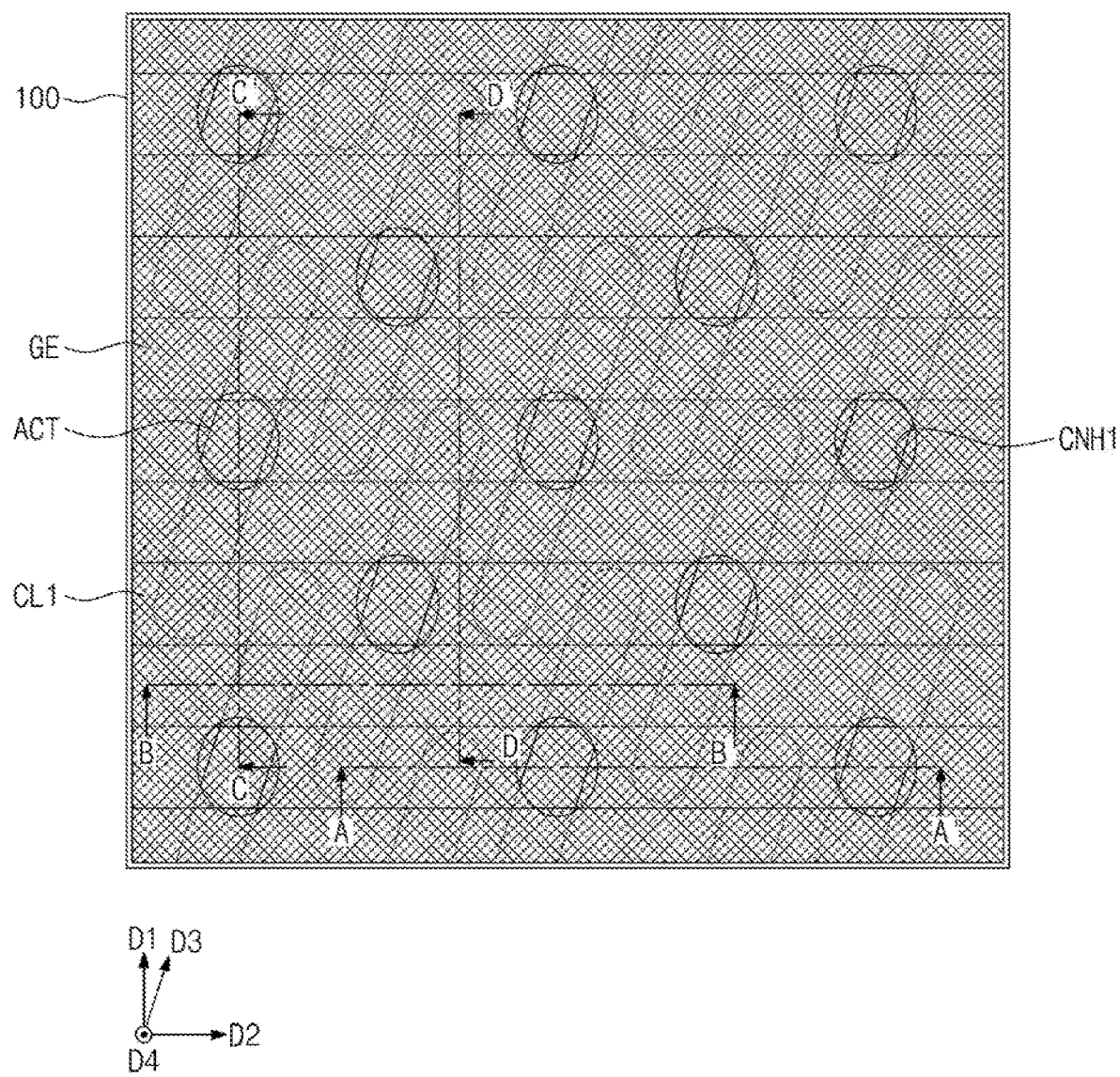
Figure 13A:
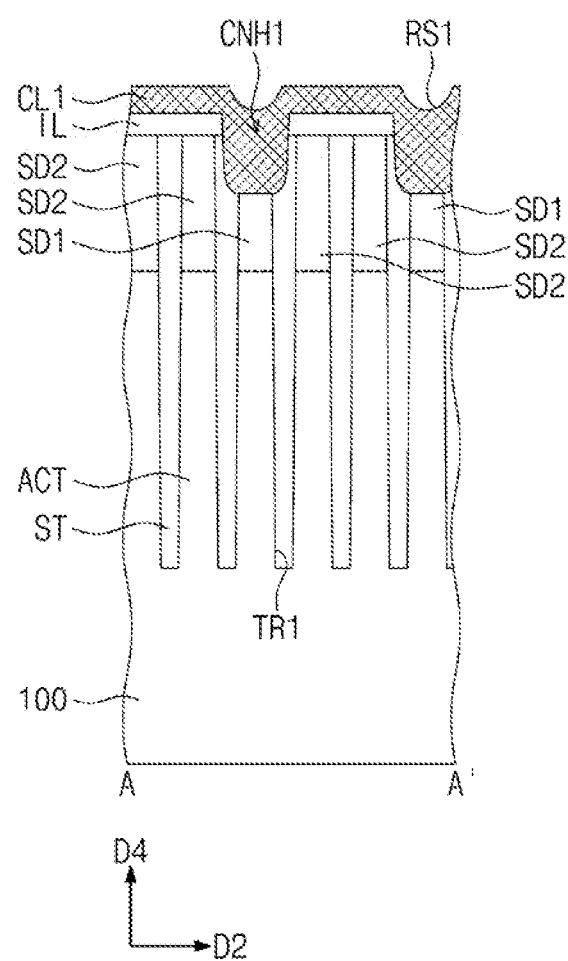
Figure 13B:
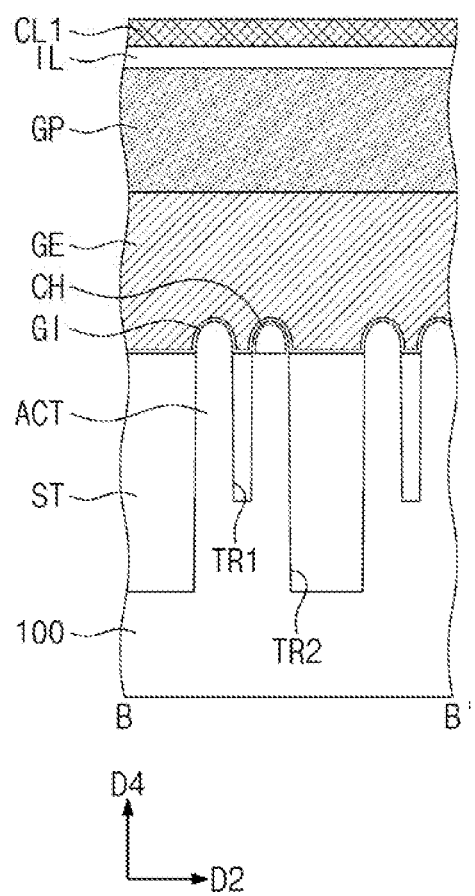
Figure 13C:
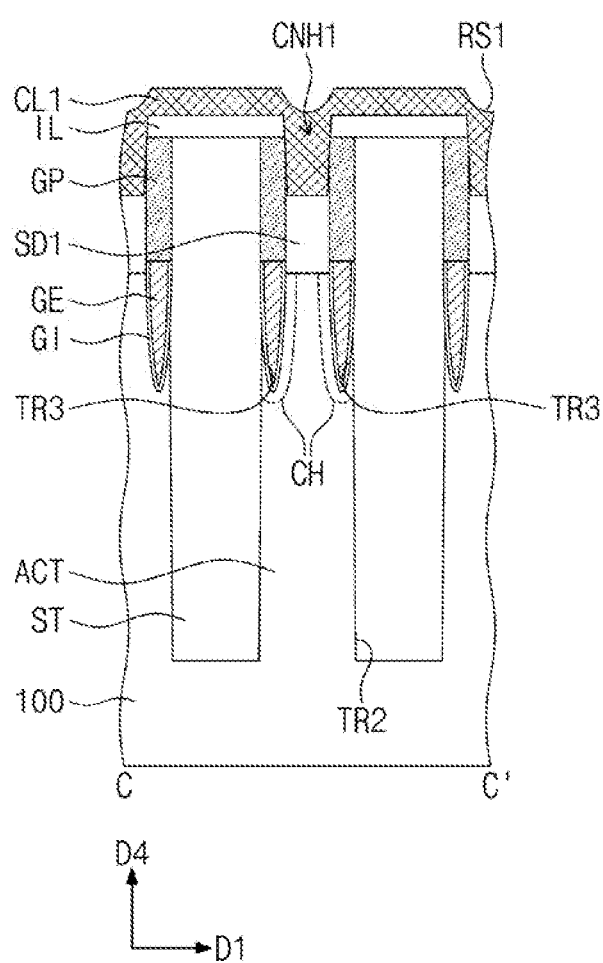
Figure 13D:
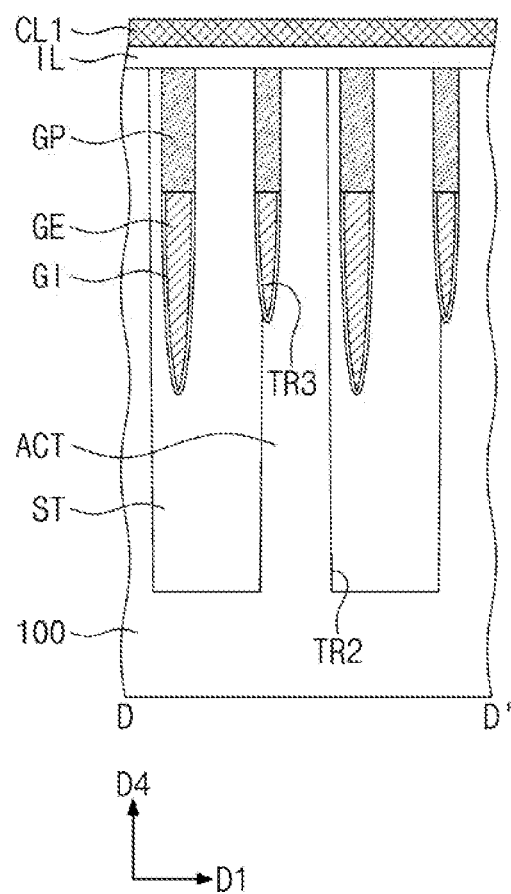
Figure 14:
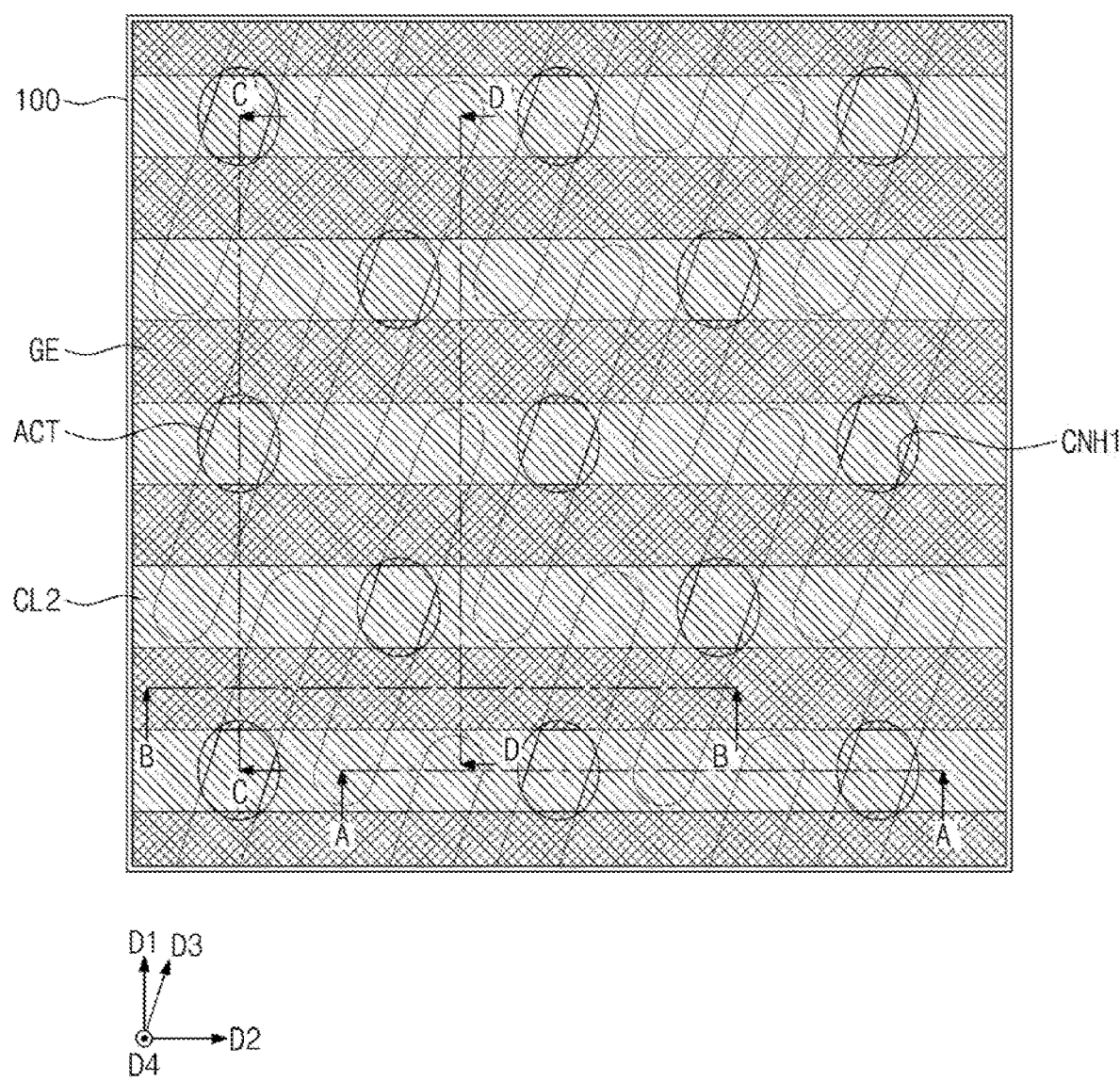
Figure 15A:
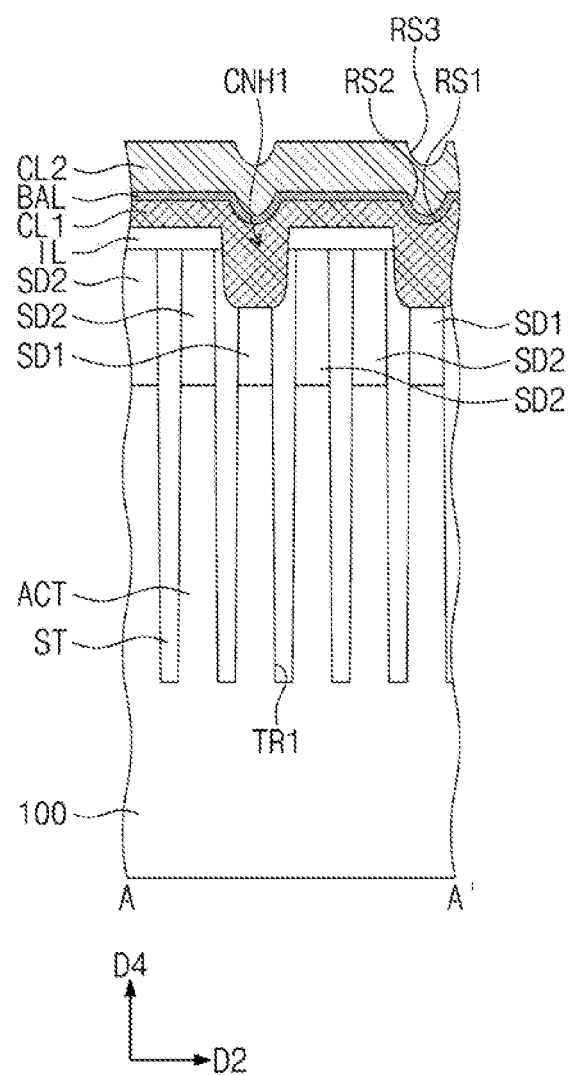
Figure 15B:
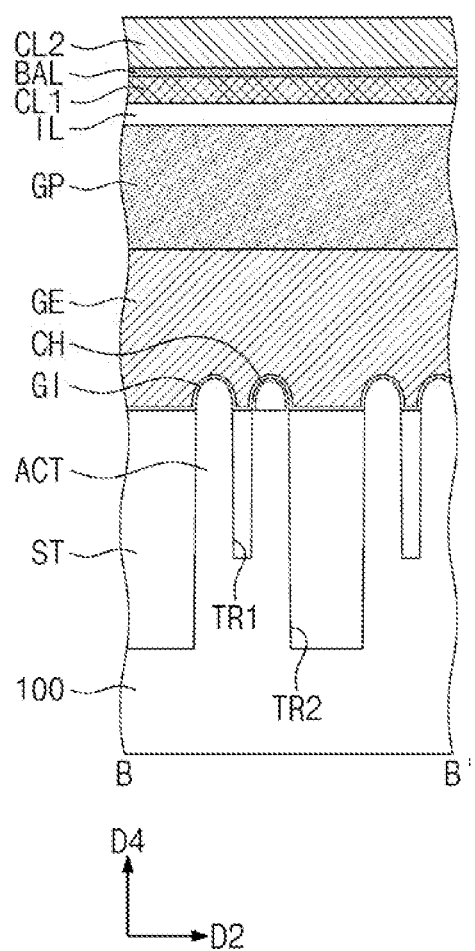
Figure 15C:
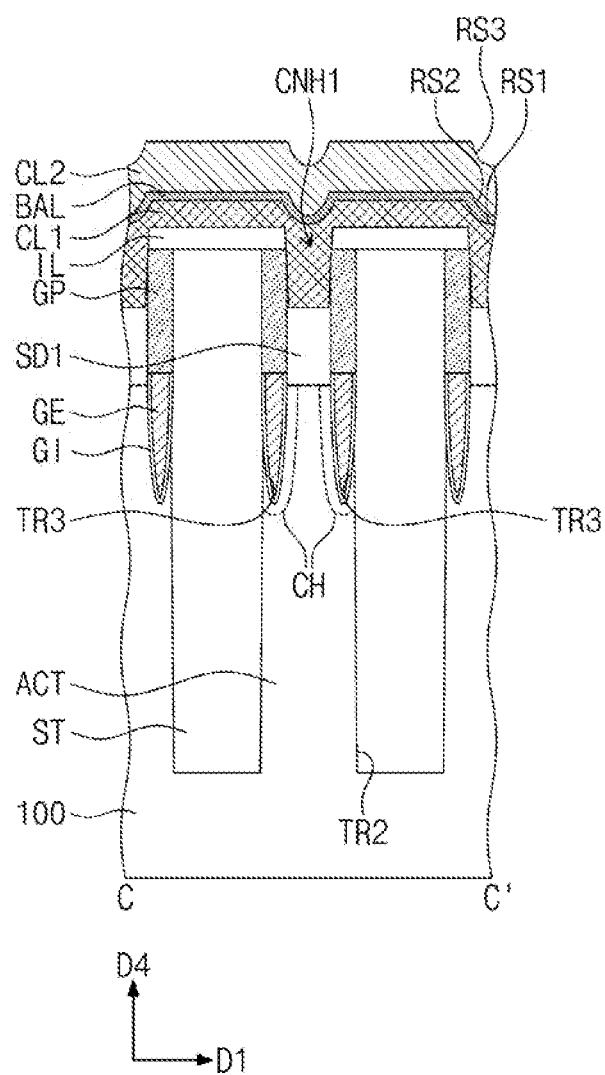
Figure 15D:
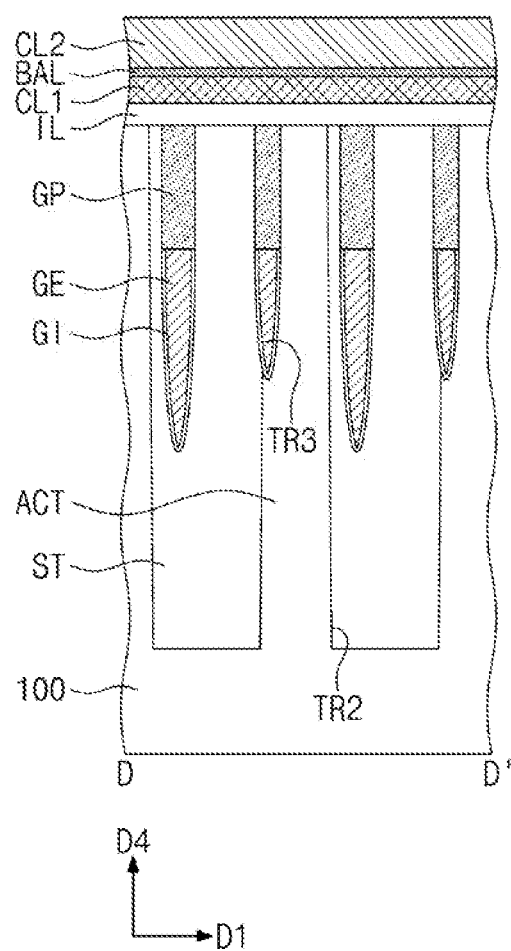
Figure 16:
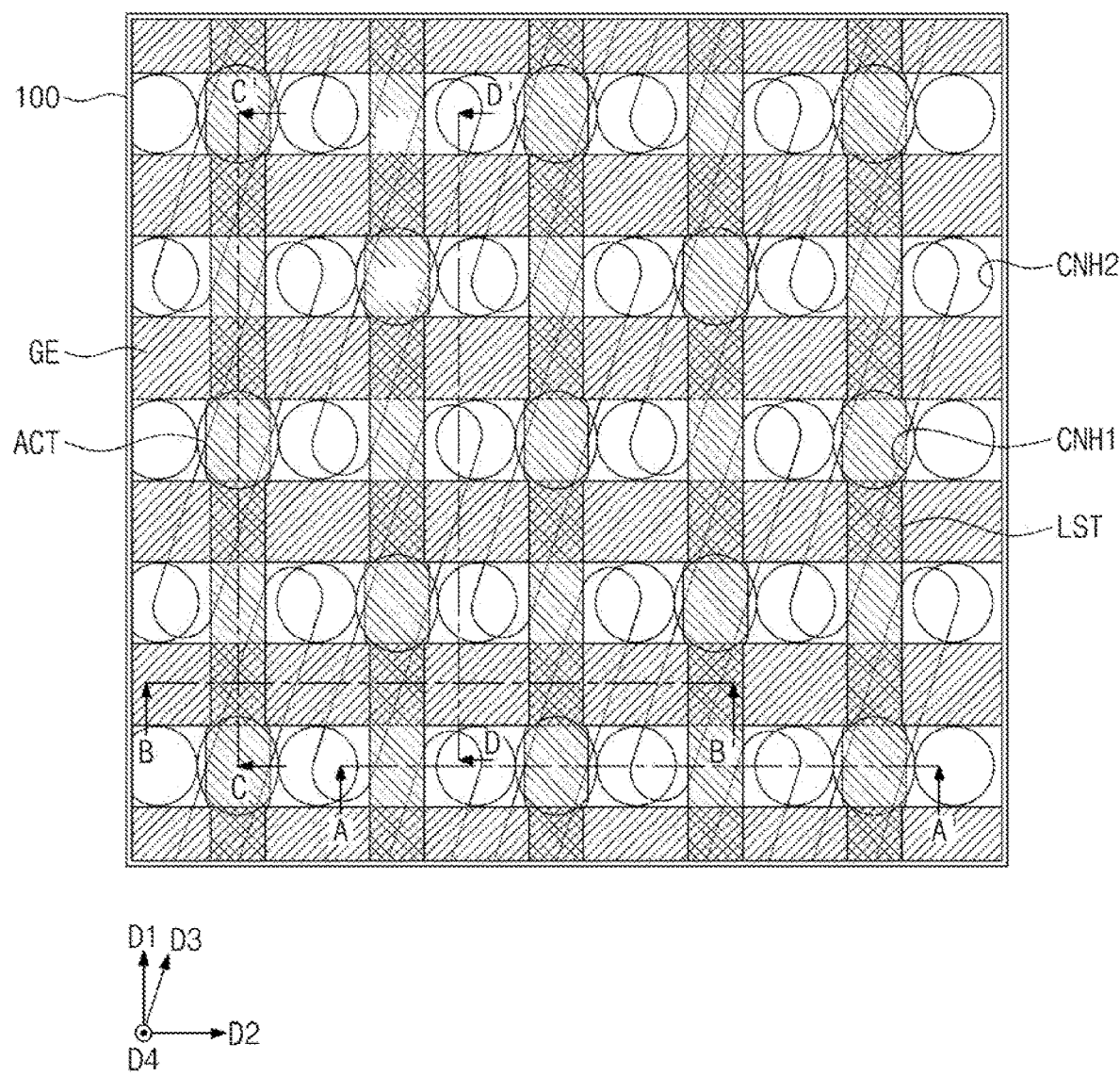
Figure 17A:
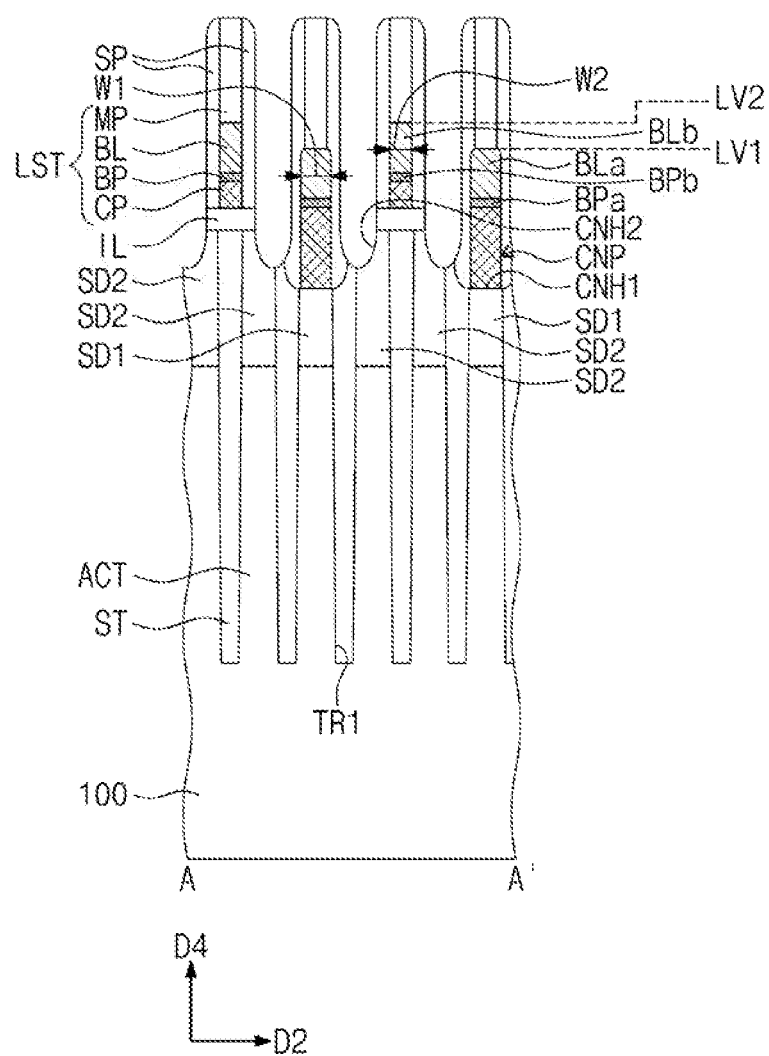
Figure 17B:
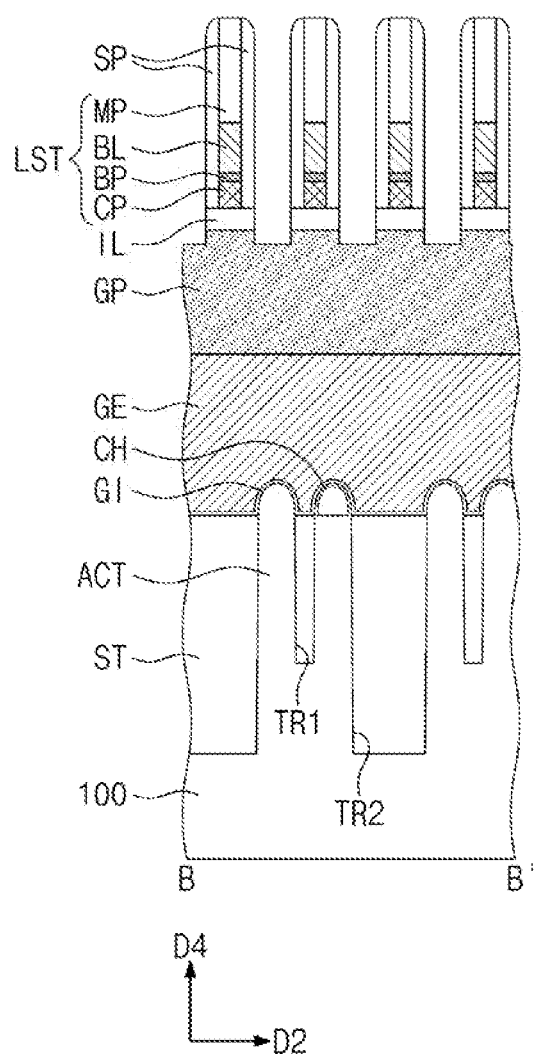
Figure 17C:
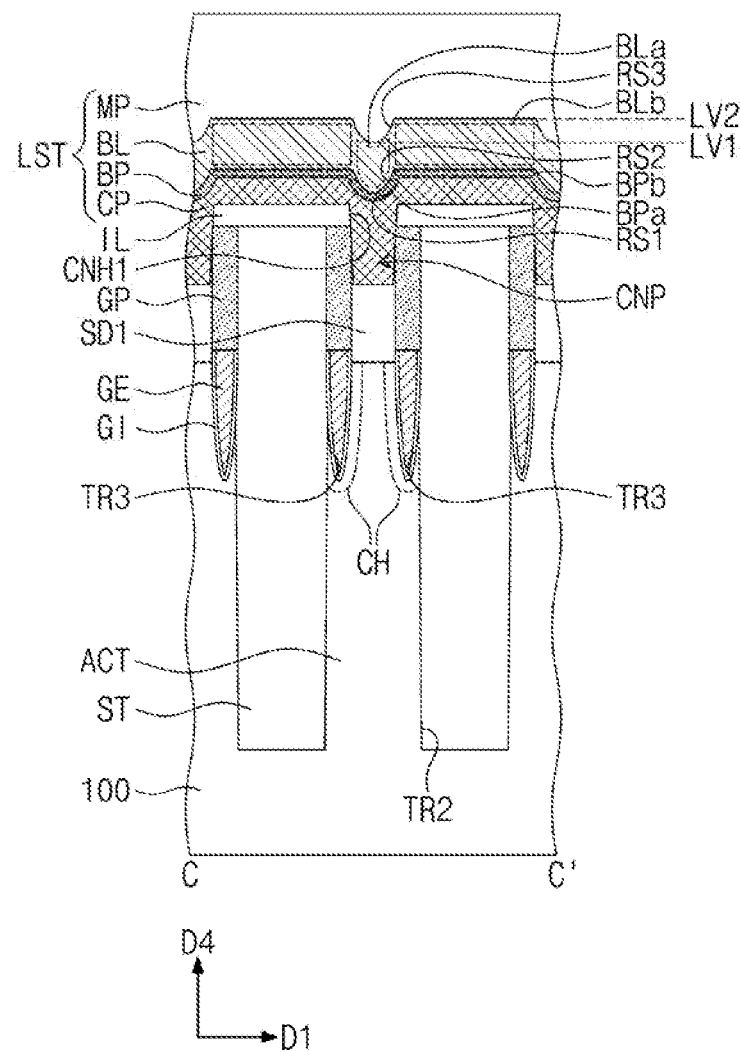
Figure 17D:
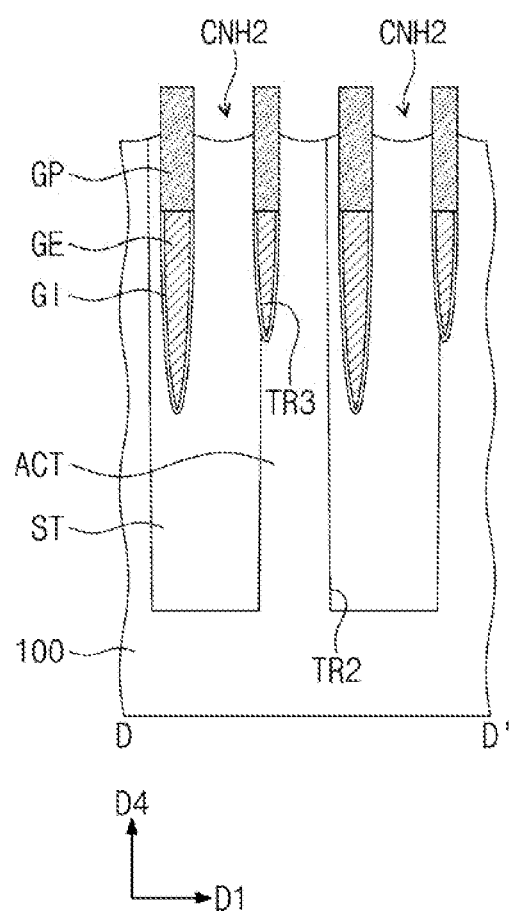
Figure 18:
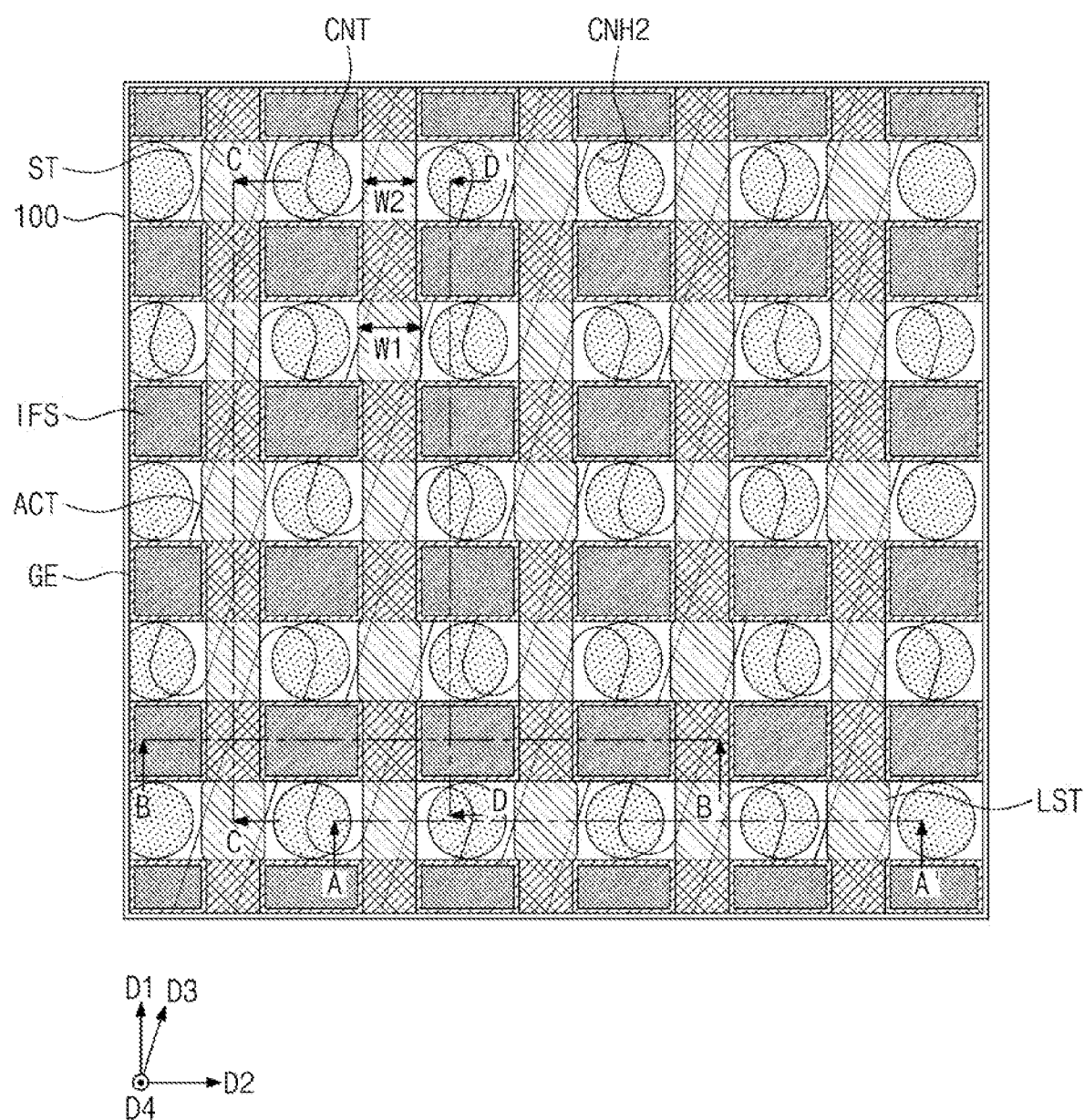
Figure 19A:
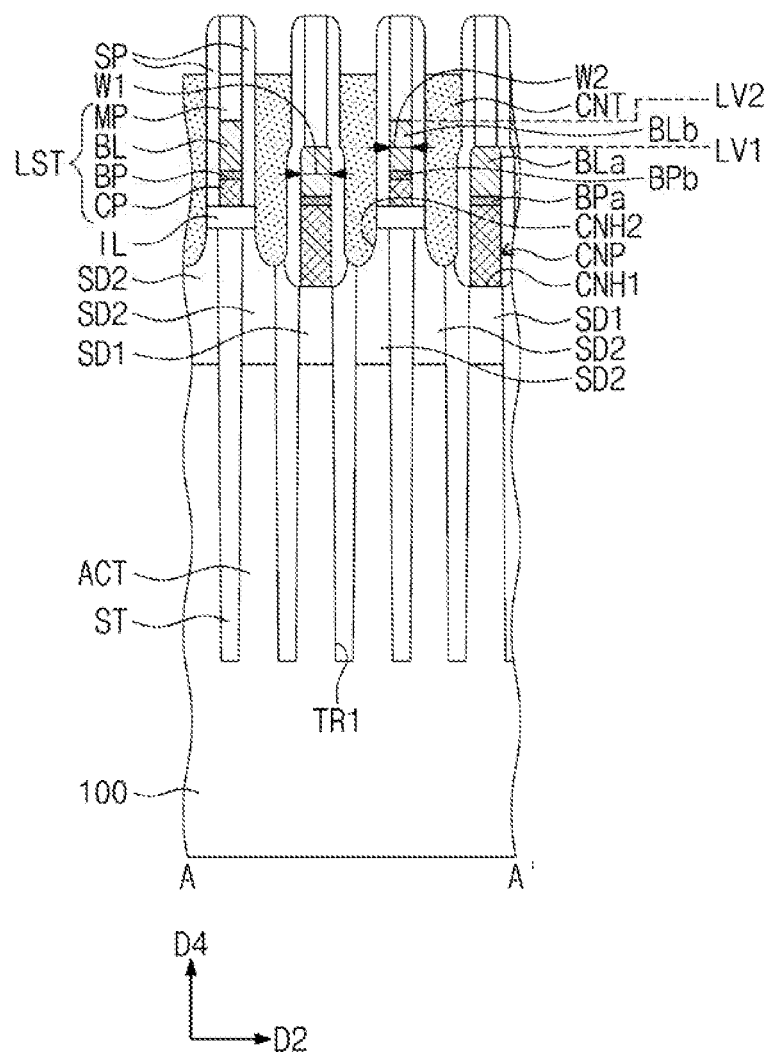
Figure 19B:
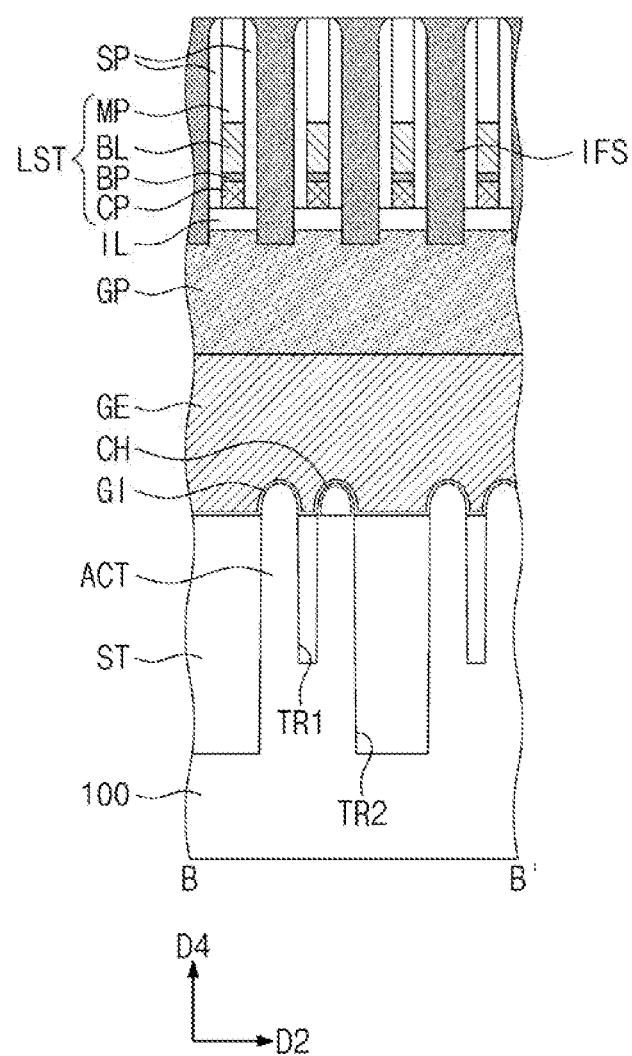
Figure 19C:
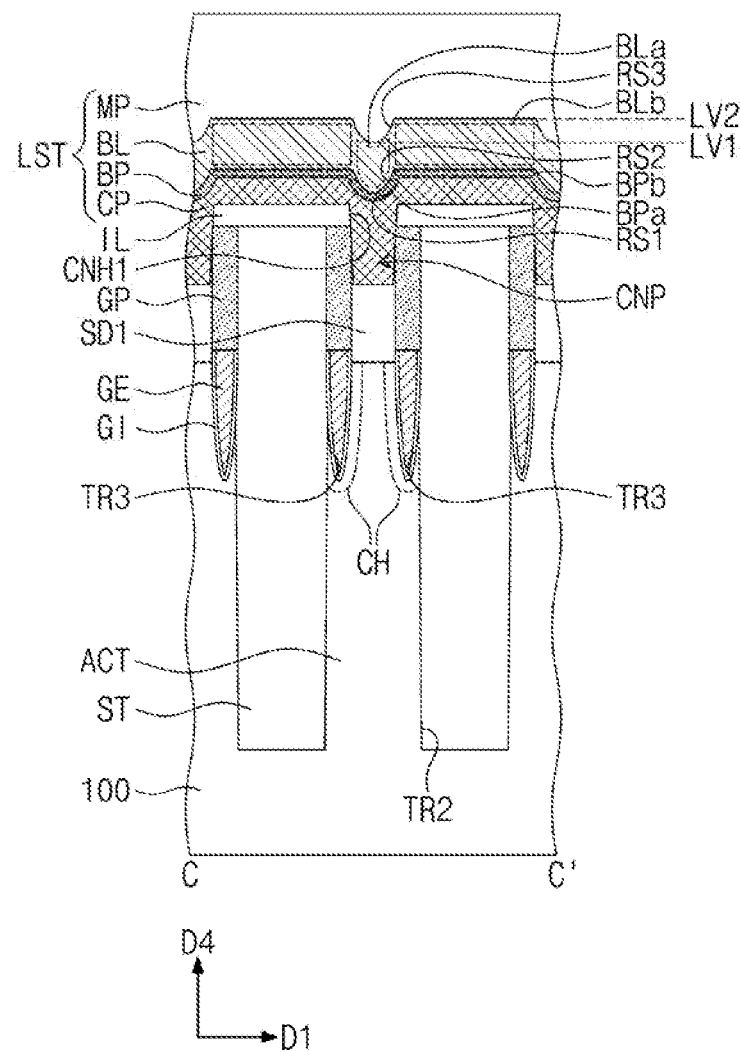
Figure 19D:
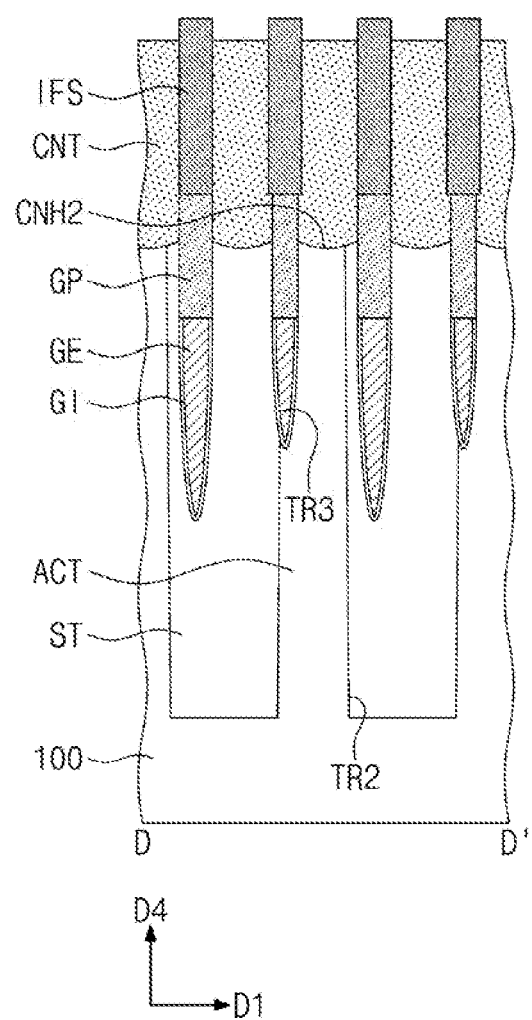

A pair of third trenches TR3 may be defined in each of the active patterns ACT (e.g., see FIG. 2C). Each of the third trenches TR3 may be defined between the first source/drain region SD1 and the second source/drain region SD2. The third trench TR3 may penetrate an upper portion of the active pattern ACT and extend from a top surface of the active pattern ACT toward the bottom surface of the substrate 100 in a downward direction (e.g., the fourth direction D4). A bottom surface of the third trench TR3 may be higher than the bottom surfaces of the first and second trenches TR1 and TR2.

The upper portion of each of the active patterns ACT may further include a pair of channel regions CH. When viewed in a plan view, the channel region CH may be between the first source/drain region SD1 and the second source/drain region SD2. The channel region CH may be below the third trench TR3 (e.g., see FIG. 2C). Thus, the channel region CH may be located at a level lower than the first and second source/drain regions SD1 and SD2.

Gate electrodes GE may cross the active patterns ACT and the device isolation layer ST. The gate electrode GE may be referred to as a 'word line'. The gate electrodes GE may be in the third trenches TR3, respectively. The gate electrodes GE may extend in the second direction D2 and parallel to each other. A pair of the gate electrodes GE may be on a pair of the channel regions CH of the active pattern ACT. In an implementation, when viewed in a plan view, the gate electrode GE may be between the first source/drain region SD1 and the second source/drain region SD2. A top surface of the gate electrode GE may be lower than the top surface of the active pattern ACT (e.g., a top surface of the first source/drain region SD1 or a top surface of the second source/drain region SD2).

Referring back to FIG. 2C, an upper portion of the gate electrode GE may be adjacent to the first source/drain region SD1 of the active pattern ACT. A lower portion of the gate electrode GE may be adjacent to the channel region CH.

Referring to FIGS. 1 and 2A to 2D, a gate dielectric layer GI may be between the gate electrode GE and the active pattern ACT. A gate capping layer GP may be on the gate electrode GE. The gate capping layer GP may cover the top surface of the gate electrode GE. A top surface of the gate capping layer GP may be coplanar with the top surface of the active pattern ACT.

The gate electrode GE may be formed of or include a conductive metal nitride (e.g., titanium nitride or tantalum nitride) or a metallic material (e.g., titanium, tantalum, tungsten, copper, or aluminum). The gate dielectric layer GI may be formed of or include silicon oxide, silicon nitride, silicon oxynitride, or a high-k dielectric material. In an implementation, the high-k dielectric material may include hafnium oxide, hafnium silicon oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide, lead zinc niobate, or combinations thereof. The gate capping layer GP may be formed of or include silicon oxide, silicon nitride, or silicon oxynitride.

An insulating layer IL may be on the substrate 100. The insulating layer IL may include first contact holes CNH1, which expose the first source/drain regions SD1 of the active patterns ACT. In an implementation, the insulating layer IL may include a silicon oxide layer and a silicon oxynitride layer, which are sequentially stacked.

Line structures LST may be on the insulating layer IL extending in the first direction D1 and parallel to each other. The line structures LST may be arranged in the second direction D2. When viewed in a plan view, the line structures LST may perpendicularly cross the gate electrodes GE (e.g., see FIG. 1). A pair of spacers SP may be on opposite side surfaces of each of the line structures LST. The spacers SP may be formed of or include silicon oxide, silicon nitride, or silicon oxynitride.

Each of the line structures LST may include a conductive pattern CP, a barrier pattern BP, a bit line BL, and a mask pattern MP, which are sequentially stacked. The conductive pattern CP may include a contact portion CNP in the first contact hole CNH1 and coupled to the first source/drain region SD1. In an implementation, the contact portion CNP may penetrate the insulating layer IL and extend toward the bottom surface of the substrate 100. The contact portion CNP may be in direct contact with the first source/drain region SD1. The contact portion CNP may have a top surface defining a first recess RS1. The first recess RS1 may be a region which is recessed from the top surface of the contact portion CNP toward the first source/drain region SD1.

The barrier pattern BP may help prevent or suppress a metallic material in the bit line BL from being diffused into the conductive pattern CP. The bit line BL may be electrically connected to the first source/drain region SD1 through the barrier pattern BP and the conductive pattern CP.

The barrier pattern BP may include a first portion BPa, which is vertically overlapped with the first source/drain region SD1, and a second portion BPb, which is vertically overlapped with the insulating layer IL. The first portion BPa of the barrier pattern BP may be vertically overlapped with the contact portion CNP. The second portion BPb of the barrier pattern BP may be horizontally or laterally offset from the first source/drain region SD1. The first portion BPa of the barrier pattern BP may fill a portion of the first recess RS1.

The first portion BPa of the barrier pattern BP may include a plurality of portions, which are bent toward the substrate 100, and may have an uneven shape (e.g., see FIG. 2C). The first portion BPa of the barrier pattern BP may have a top surface defining a second recess RS2. The second recess RS2 may be a region which extends from the top surface of the first portion BPa of the barrier pattern BP toward the first source/drain region SD1. The lowermost level of a bottom surface of the first portion BPa of the barrier pattern BP may be at a level lower than a lowermost level of a bottom surface of the second portion BPb of the barrier pattern BP. The lowermost level of the top surface of the first portion BPa of the barrier pattern BP may be at a level lower than the lowermost level of the top surface of the second portion BPb of the barrier pattern BP.

The conductive pattern CP may be formed of or include a doped semiconductor material (e.g., doped silicon or doped germanium). The barrier pattern BP may be formed of or include a conductive metal nitride (e.g., titanium nitride or tantalum nitride). The bit line BL may be formed of or include a metallic material (e.g., a non-compounded metal). In an implementation, the bit line BL may be formed of or include molybdenum (Mo) or ruthenium (Ru). In an implementation, the bit line BL may be formed of or include titanium, tantalum, tungsten, copper, or aluminum. In an implementation, a portion of the conductive pattern CP, which is located on the insulating layer IL, may be referred to as a 'polysilicon line'. The bit line BL may be referred to as a 'metal line'. The contact portion CNP of the conductive pattern CP may be referred to as a 'bit line contact'.

The bit line BL may include a first portion BLa, which is vertically overlapped with the first source/drain region SD1, and a second portion BLb, which is vertically overlapped with the insulating layer IL. The first portion BLa of the bit line BL may be vertically overlapped with the contact portion CNP. The second portion BLb of the bit line BL may be horizontally offset from the first source/drain region SD1. The first portion BLa of the bit line BL may fully fill the second recess RS2. The largest width (e.g., in the second direction D2) of the first portion BLa of the bit line BL may be a first width W1. The largest width of the second portion BLb of the bit line BL may be a second width W2. The first width W1 may be larger than the second width W2.

The first portion BLa of the bit line BL may have a top surface defining a third recess RS3. The third recess RS3 may be a region which is recessed from the top surface of the first portion BLa of the bit line BL toward the first source/drain region SD1. The lowermost level of the top surface of the first portion BLa of the bit line BL may be a first level LV1. The lowermost level of the top surface of the second portion BLb of the bit line BL may be a second level LV2. The first level LV1 may be lower than (e.g., closer to the substrate 100 in the fourth direction D4 than) the second level LV2. The lowermost level of a bottom surface of the first portion BLa of the bit line BL may be at a level lower than the lowermost level of a bottom surface of the second portion BLb of the bit line BL.

The mask pattern MP may be on the bit line BL. The mask pattern MP may fully or completely fill the third recess RS3. A top surface of the mask pattern MP may be flat.

A plurality of insulating fences IFS may be on the gate capping layer GP. Each of the insulating fences IFS may penetrate the insulating layer IL and extend to an upper portion of the gate capping layer GP.

Referring back to FIG. 1, the insulating fences IFS may be two-dimensionally arranged in the first and second directions D1 and D2. In an implementation, the insulating fences IFS may be on the gate capping layer GP, which is extended in the second direction D2, and may be arranged in the second direction D2. The insulating fences IFS and the line structures LST may be alternately arranged in the second direction D2.

Contacts CNT may penetrate the insulating layer IL and may be coupled to the second source/drain regions SD2, respectively. The contact CNT may be referred to as a 'storage node contact'. Each of the contacts CNT may fill a second contact hole CNH2, which is formed by partially etching an upper portion of the second source/drain region SD2. Referring back to FIG. 2A, the contact CNT may be in direct contact with a portion of the second source/drain region SD2, which is exposed by the second contact hole CNH2. In an implementation, the contact CNT may be in contact with a side surface of the spacer SP and a top surface of the device isolation layer ST. The contact CNT may be spaced apart from the line structure LST adjacent thereto by the spacer SP. Each of the contacts CNT may be formed of or include a doped semiconductor material (e.g., doped silicon or doped germanium).

Referring back to FIG. 1, the contacts CNT may be two-dimensionally arranged in the first and second directions D1 and D2. In an implementation, the contacts CNT and the line structures LST may be alternately arranged in the second direction D2. The contacts CNT and the insulating fences IFS may be alternately arranged in the first direction D1.

Landing pads LP, which are respectively coupled to the contacts CNT, may be on the contacts CNT. The landing pads LP may be electrically connected to the second source/drain regions SD2, respectively, through the contacts CNT. The landing pad LP may be misaligned from the contact CNT. In an implementation, a center of the landing pad LP may be horizontally or laterally offset from a center of the contact CNT (e.g., see FIG. 2A). The landing pads LP may be formed of or include a metallic material (e.g., titanium, tantalum, tungsten, copper, or aluminum).

An insulating pattern INP may be on the mask patterns MP. The insulating pattern INP may define a planar shape of the landing pads LP. Adjacent ones of the landing pads LP may be separated from each other by the insulating pattern INP.

A data storing element DS may be on the landing pad LP. In an implementation, the data storing element DS may include first electrodes LEL, which are respectively provided on the landing pads LP. The first electrodes LEL may be connected to the landing pads LP, respectively. The data storing element DS may further include a second electrode TEL on the first electrodes LEL and a dielectric layer HDL between the first electrodes LEL and the second electrode TEL. The first electrode LEL, the dielectric layer HDL, and the second electrode TEL may constitute a capacitor, which is used to store data.

In an implementation, each of the first electrodes LEL may be in the form of a solid pillar. In an implementation, each of the first electrodes LEL may be shaped like a cylinder with a closed bottom. The first electrodes LEL may be arranged in the first or second direction D1 or D2 to form a zigzag or honeycomb shape. In an implementation, the first electrodes LEL may be arranged in the first and second directions D1 and D2 to form a matrix shape.

Each of the first electrodes LEL may be formed of or include, e.g., impurity-doped silicon, a metal (e.g., tungsten), or a conductive metal compound (e.g., titanium nitride). The dielectric layer HDL may be formed of or include a high-k dielectric material (e.g., hafnium oxide, hafnium silicon oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide, lead zinc niobate, or combinations thereof). The second electrode TEL may be formed of or include doped silicon, Ru, RuO, Pt, PtO, Ir, SrRuO (SRO), (Ba,Sr)RuO (BSRO), CaRuO (CRO), BaRuO, La(Sr,Co)O, Ti, TiN, W, WN, Ta, TaN, TiAlN, TiSiN, TaAlN, TaSiN, or combinations thereof.

The line structure LST and the contact CNT will be described in more detail with reference to FIG. 3. The contact CNT may include an upper portion UPP, which is at a level higher than the first portion BLa of the bit line BL, and a lower portion LOP, which is in contact with a recessed top surface of the second source/drain region SD2 and is below the upper portion UPP. The lower portion LOP may be in the second contact hole CNH2, which is lower than the top surface of the substrate 100 (i.e., the top surface of the active pattern ACT).

A width of the upper portion UPP of the contact CNT may be a third width W3. A width of the lower portion LOP of the contact CNT may be a fourth width W4. The third width W3 may be larger than the fourth width W4.

As described above, the largest width of the first portion BLa of the bit line BL may be the first width W1. The largest width of the second portion BLb of the bit line BL may be the second width W2. The first width W1 may be larger than the second width W2. A width of the first portion BPa of the barrier pattern BP may be substantially equal to the first width W1. A width of the contact portion CNP of the conductive pattern CP may be substantially equal to the first width W1. A width of the second portion BPb of the barrier pattern BP may be substantially equal to the second width W2. A width of the conductive pattern CP, which is vertically overlapped with the insulating layer IL, may be substantially equal to the second width W2 (e.g., see FIGS. 1 and 3).

In an implementation, a width of each of the first portion BLa of the bit line BL, the first portion BPa of the barrier pattern BP, and the contact portion CNP, which are vertically overlapped with the first source/drain region SD1, may be larger than a width of each of the second portion BLb of the bit line BL, the second portion BPb of the barrier pattern BP, and the conductive pattern CP, which are vertically overlapped with the insulating layer IL.

As will be described below, this may be because the first level LV1 may be lower than the second level LV2, and etching amounts of the bit line BL, the barrier pattern BP, and the conductive pattern CP in a process of patterning the line structure LST may be reduced. Accordingly, it may be possible to help prevent a width of the contact portion CNP, which is in contact with the first source/drain region SD1, from being reduced. In addition, the first level LV1 may be lower than the second level LV2, and a distance between the first portion BLa of a first bit line (BL1) and the second portion BLb of a second bit line (BL2), which are adjacent to each other in the second direction D2, may be increased. Accordingly, a parasitic capacitance between adjacent ones of the bit lines BL may be reduced. As a result, electric characteristics of a semiconductor memory device may be improved.

FIGS. 4, 6, 8, 10, 12, 14, 16, and 18 are plan views of stages in a method of fabricating a semiconductor device according to an embodiment. FIGS. 5A, 7A, 9A, 11A, 13A, 15A, 17A, and 19A are sectional views taken along lines A-A' of FIGS. 4, 6, 8, 10, 12, 14, 16, and 18, respectively. FIGS. 5B, 7B, 9B, 11B, 13B, 15B, 17B, and 19B are sectional views taken along lines B-B' of FIGS. 4, 6, 8, 10, 12, 14, 16, and 18, respectively. FIGS. 5C, 7C, 9C, 11C, 13C, 15C, 17C, and 19C are sectional views taken along lines C-C' of FIGS. 4, 6, 8, 10, 12, 14, 16, and 18, respectively. FIGS. 5D, 7D, 9D, 11D, 13D, 15D, 17D, and 19D are sectional views taken along lines D-D' of FIGS. 4, 6, 8, 10, 12, 14, 16, and 18, respectively.

Referring to FIGS. 4 and 5A to 5D, the active patterns ACT may be formed by patterning an upper portion of the substrate 100. Each of the active patterns ACT may extend in the third direction D3 parallel to the top surface of the substrate 100. The active patterns ACT may be two-dimensionally arranged in the first and second directions D1 and D2. The active patterns ACT may be spaced apart from each other in the third direction D3.

The first and second trenches TR1 and TR2 may be defined between the active patterns ACT. The first trench TR1 may be defined between a pair of active patterns ACT, which are adjacent to each other in the second direction D2. The second trench TR2 may be defined between a pair of the active patterns ACT, which are adjacent to each other in the third direction D3.

The device isolation layer ST may be formed to fill the first and second trenches TR1 and TR2. The device isolation layer ST may be formed to fully fill the first and second trenches TR1 and TR2 and to cover the active patterns ACT. A planarization process may be performed on the device isolation layer ST to expose the top surfaces of the active patterns ACT.

Referring to FIGS. 6 and 7A to 7D, the third trenches TR3 may be formed by patterning the active patterns ACT and the device isolation layer ST. When viewed in a plan view, each of the third trenches TR3 may be a line-shaped region extending in the second direction D2.

The formation of the third trenches TR3 may include forming a hard mask pattern with openings and etching exposed portions of the active patterns ACT and the device isolation layer ST, which are not veiled or covered by the hard mask pattern serving as an etch mask. The third trench TR3 may be formed to be shallower than the first trench TR1.

Referring to FIGS. 8 and 9A to 9D, the gate dielectric layer GI, the gate electrode GE, and the gate capping layer GP may be sequentially formed in each of the third trenches TR3. In an implementation, the gate dielectric layer GI may be conformally formed in the third trench TR3. The gate dielectric layer GI may be formed of or include silicon oxide, silicon nitride, silicon oxynitride, or a high-k dielectric material.

The gate electrode GE may be formed by forming a conductive layer on the gate dielectric layer GI to fill the third trench TR3. The conductive layer may be formed of or include a conductive metal nitride or a metallic material.

The gate dielectric layer GI and the gate electrode GE may be recessed, and then, the gate capping layer GP may be formed on the recessed gate electrode GE. A top surface of the gate capping layer GP may be coplanar with the top surface of the active pattern ACT.

An ion implantation process may be performed on the active patterns ACT to form the first source/drain region SD1 and a pair of the second source/drain regions SD2 in an upper portion of the active pattern ACT. The pair of the second source/drain regions SD2 may be spaced apart from each other in the third direction D3 with the first source/drain region SD1 therebetween. In an implementation, the first and second source/drain regions SD1 and SD2 may be doped with impurities of the same kind.

The channel region CH may be defined in a portion of the active pattern ACT located below the gate electrode GE. When viewed in a plan view, the channel region CH may be between the first source/drain region SD1 and the second source/drain region SD2. The gate electrode GE may be on a top surface and opposite side surfaces of the channel region CH (e.g., see FIG. 9B).

Referring to FIGS. 10 and 11A to 11D, the insulating layer IL may be formed on the entire top surface of the substrate 100. In an implementation, the insulating layer IL may be a multi-layered structure, in which a silicon oxide layer and a silicon oxynitride layer are stacked. The insulating layer IL may be patterned to form first contact holes CNH1, each of which exposes a corresponding one of the first source/drain regions SD1 of the active patterns ACT. When the first contact hole CNH1 is formed, an upper portion of the first source/drain region SD1 may be partially recessed. Similarly, when the first contact hole CNH1 is formed, an upper portion of the device isolation layer ST around the first source/drain region SD1 may be partially recessed.

Referring to FIGS. 12 and 13A to 13D, a first conductive layer CL1 may be formed on the insulating layer IL. The first conductive layer CL1 may be formed to fill the first contact holes CNH1. In an implementation, the first conductive layer CL1 may be in contact with the first source/drain regions SD1 of the active patterns ACT. The first conductive layer CL1 may be vertically spaced apart from the second source/drain regions SD2 of the active patterns ACT by the insulating layer IL. The first conductive layer CL1 may be formed of or include a doped semiconductor material.

The first conductive layer CL1 may include the first recess RS1 which is defined on a top surface thereof. The first recess RS1 may be vertically overlapped with the first contact hole CNH1. In an implementation, due to the presence of the first contact hole CNH1, a portion of the top surface of the first conductive layer CL1 may be recessed toward the first source/drain region SD1, when the first conductive layer CL1 is formed, and in this case, the recessed portion of the first conductive layer CL1 may form the first recess RS1.

In an implementation, the formation of the first recess RS1 may include forming the first conductive layer CL1, forming a mask pattern, which is vertically overlapped with the insulating layer IL, on the first conductive layer CL1, and etching a portion of the first conductive layer CL1 exposed by the mask pattern.

Referring to FIGS. 14 and 15A to 15D, a barrier layer BAL and a second conductive layer CL2 may be sequentially formed on the first conductive layer CL1. The barrier layer BAL may be between the first conductive layer CL1 and the second conductive layer CL2. The barrier layer BAL may be formed of or include a conductive metal nitride. The barrier layer BAL may be formed to fill a portion of the first recess RS1. Due to the presence of the first recess RS1, the second recess RS2 may be formed on a top surface of the barrier layer BAL. The second recess RS2 may be vertically overlapped with the first recess RS1. The second conductive layer CL2 may be formed of or include a metallic material. The barrier layer BAL may help prevent or suppress the metal material in the second conductive layer CL2 from being diffused into the first conductive layer CL1. The second conductive layer CL2 may be formed to fully fill the second recess RS2. Due to the presence of the second recess RS2, the third recess RS3 may be formed on a top surface of the second conductive layer CL2. The third recess RS3 may be vertically overlapped with the second recess RS2.

Referring to FIGS. 16 and 17A to 17D, the line structures LST may be formed on the insulating layer IL to extend in the first direction D1 and parallel to each other. The line structures LST may be arranged in the second direction D2.

In an implementation, the mask patterns MP may be formed on the second conductive layer CL2. The mask patterns MP may be formed to have a line shape extending in the first direction D1. In an implementation, the mask patterns MP may be formed of or include silicon nitride or silicon oxynitride. The mask pattern MP may be provided to fill the third recess RS3.

The bit line BL, the barrier pattern BP, and the conductive pattern CP may be respectively formed by sequentially patterning the second conductive layer CL2, the barrier layer BAL, and the first conductive layer CL1 using the mask patterns MP as a mask. The mask pattern MP, the bit line BL, the barrier pattern BP, and the conductive pattern CP may be vertically overlapped with each other. The mask pattern MP, the bit line BL, the barrier pattern BP, and the conductive pattern CP may constitute the line structure LST. When viewed in a plan view, the bit lines BL may extend to cross the gate electrodes GE.

The bit line BL may include the first portion BLa, which is vertically overlapped with the first source/drain region SD1, and the second portion BLb, which is vertically overlapped with the insulating layer IL. The lowermost level of the top surface of the first portion BLa of the bit line BL may be the first level LV1. The lowermost level of the top surface of the second portion BLb of the bit line BL may be the second level LV2. Due to the first to third recesses RS1, RS2, and RS3, the first level LV1 may be lower than the second level LV2.

The largest width of the first portion BLa of the bit line BL may be the first width W1. The largest width of the second portion BLb of the bit line BL may be the second width W2. The first width W1 may be larger than the second width W2.

In an implementation, the first level LV1 may be lower than the second level LV2, and it may be possible to reduce etching amounts of the bit line BL, the barrier pattern BP, and the conductive pattern CP, which are vertically overlapped with the first source/drain region SD1, in the process of patterning the line structure LST. Accordingly, it may be possible to prevent a width of the contact portion CNP, which is in contact with the first source/drain region SD1, from being reduced. In addition, the first level LV1 may be lower than the second level LV2, and a distance between the first portion BLa of the bit line BL and the second portion BLb of the bit line BL, which are adjacent to each other in the second direction D2, may be increased. Accordingly, a parasitic capacitance between adjacent ones of the bit lines BL may be reduced. As a result, electric characteristics of a semiconductor memory device may be improved.

Referring to FIGS. 18 and 19A to 19D, a plurality of the insulating fences IFS may be formed on the gate capping layer GP. The insulating fences IFS may not be overlapped with the second contact holes CNH2 and may be formed to expose the second contact holes CNH2.

The contacts CNT may be respectively formed in the second contact holes CNH2 by filling the second contact holes CNH2 with a conductive material. The contacts CNT may be connected to the second source/drain regions SD2. In an implementation, the conductive material may be formed on the entire top surface of the substrate 100 and may be recessed until a top surface of the conductive material is lower than top surfaces of the insulating fences IFS. In this case, the conductive material may be cut by the insulating fences IFS, and as a result, the contacts CNT may be formed in the second contact holes CNH2, respectively. The contacts CNT and the insulating fences IFS may be alternately arranged in the first direction D1.

The conductive material filling the second contact holes CNH2 may be formed of or include a doped semiconductor material. In an implementation, the second contact holes CNH2 may be filled with a doped semiconductor material, and then, impurities in the semiconductor material may be diffused into the second source/drain regions SD2. The diffusion of the impurity may be performed using a metallurgical process.

Referring back to FIGS. 1 and 2A to 2D, the landing pads LP may be formed on the contacts CNT, respectively. In an implementation, a metal layer may be formed on the contacts CNT and the insulating fences IFS. The metal layer may be patterned to form the landing pads LP. The insulating pattern INP may be formed by filling a space between the landing pads LP with an insulating material. The first electrodes LEL may be formed on the landing pads LP, respectively. The dielectric layer HDL may be conformally formed on the first electrodes LEL. The second electrode TEL may be formed on the dielectric layer HDL. The first electrode LEL, the dielectric layer HDL, and the second electrode TEL may constitute the data storing element DS (e.g., a capacitor). In an implementation, a plurality of interconnection layers may be stacked on the second electrode TEL.

Figure 20A:
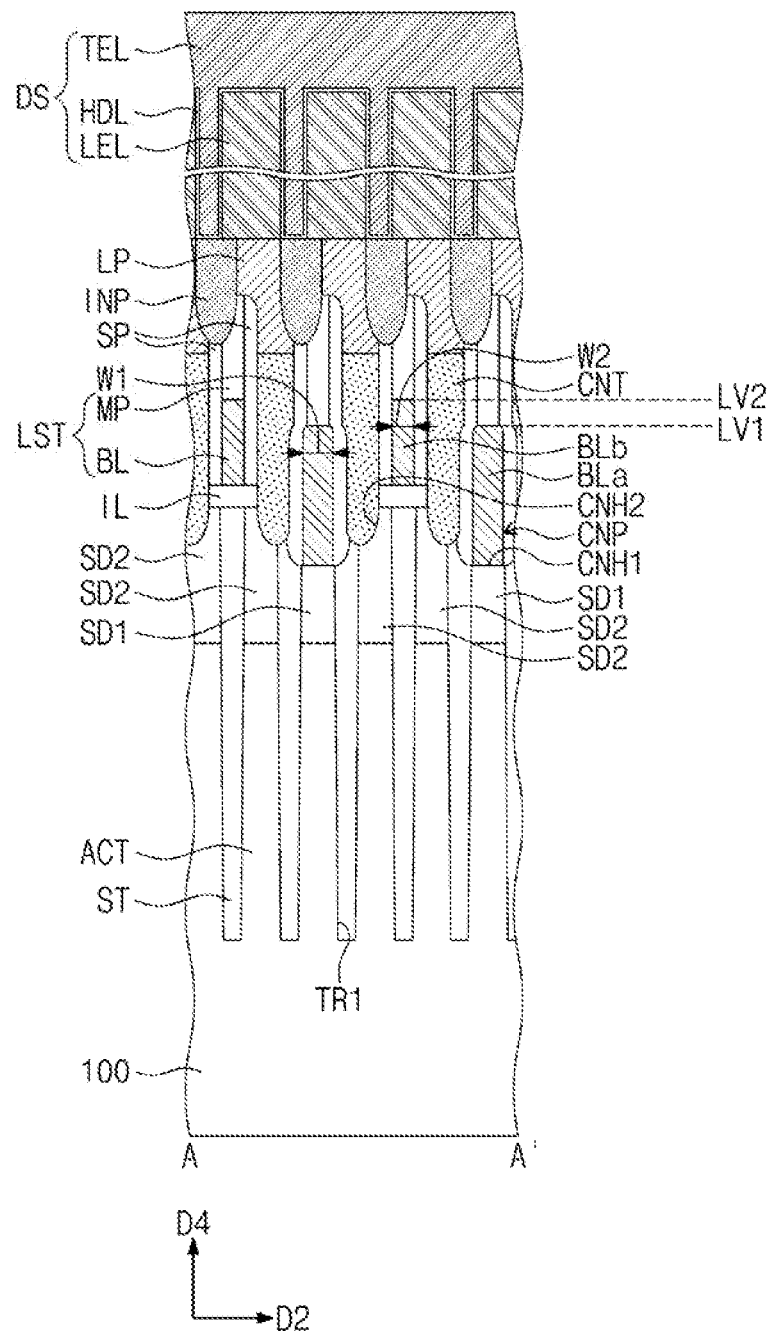
FIGS. 20A, 20B, and 20C are sectional views, which are respectively taken along the lines A-A', B-B', and C-C' of FIG. 1, of a semiconductor device according to an embodiment.
Figure 20B:
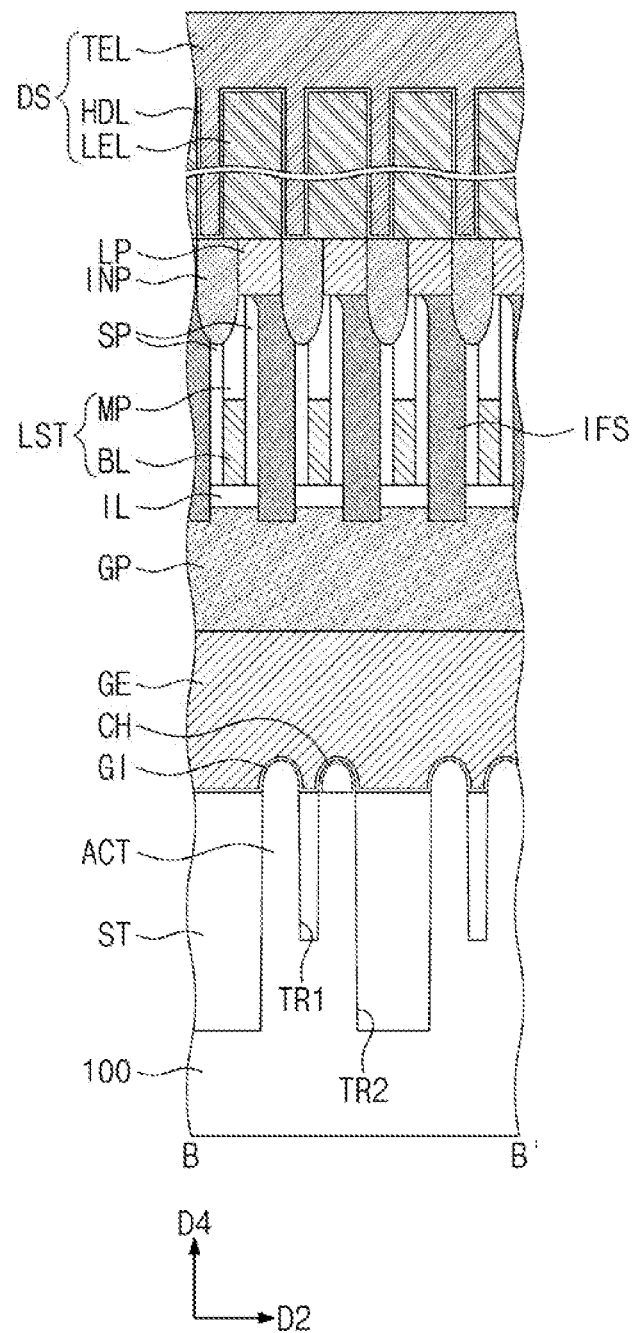
Figure 20C:
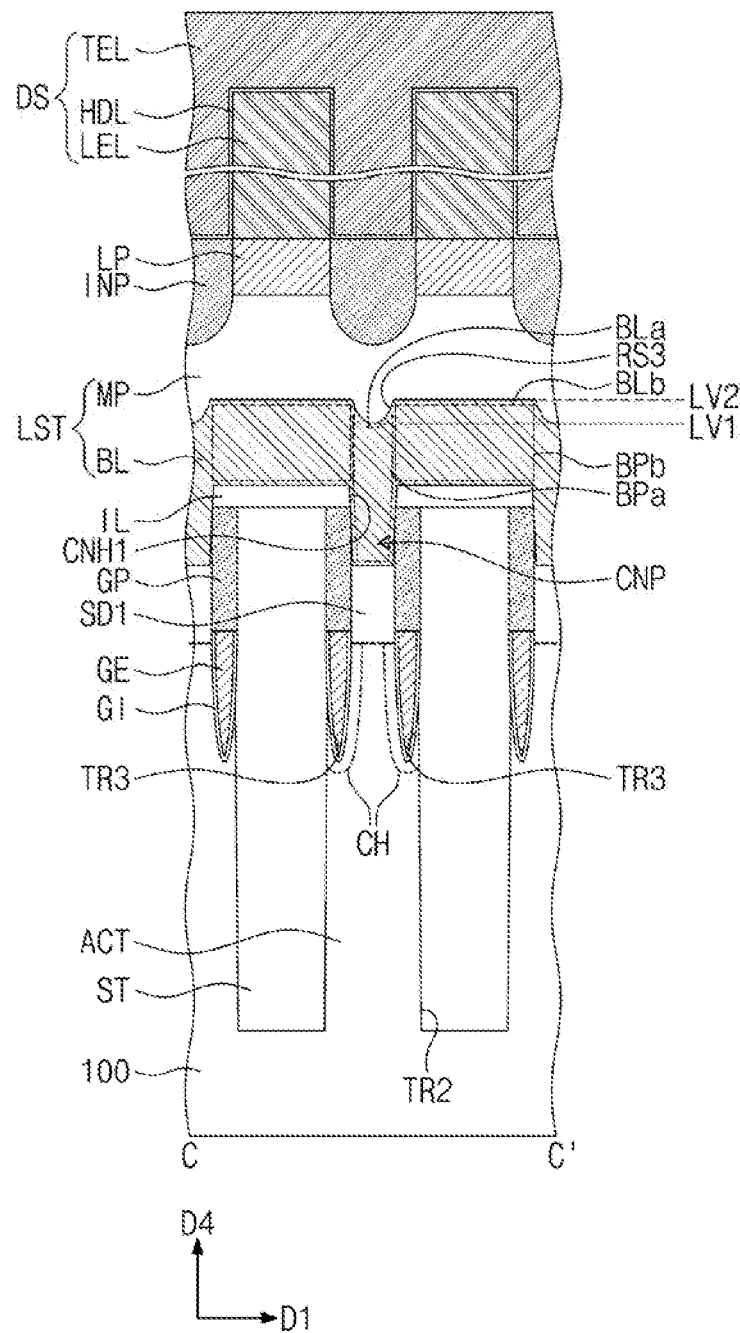

FIGS. 20A, 20B, and 20C are sectional views, which are respectively taken along the lines A-A', B-B', and C-C' of FIG. 1, or a semiconductor device according to an embodiment. For concise description, an element previously described with reference to FIGS. 1 and 2A to 2D may be identified by the same reference number without repeating an overlapping description thereof.

Referring to FIGS. 1 and 20A to 20C, the line structure LST may include the mask pattern MP and the bit line BL. In an implementation, the line structure LST in the present embodiment may not include the barrier pattern BP and the conductive pattern CP described with reference to FIGS. 1 and 2A to 2D. The first portion BLa of the bit line BL may penetrate the insulating layer IL and may be in contact with the first source/drain region SD1. The second portion BLb of the bit line BL may be in contact with the insulating layer IL.

Figure 21A:
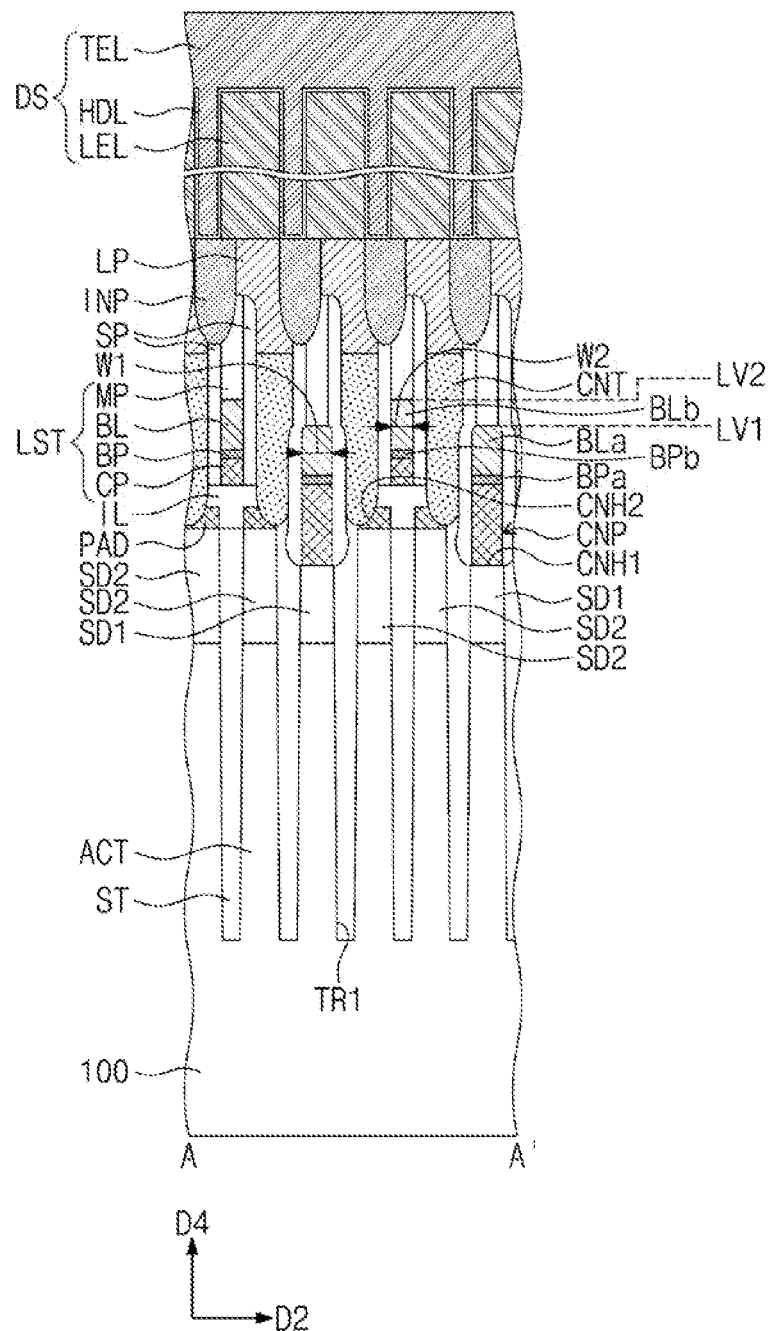
FIGS. 21A and 21B are sectional views, which are respectively taken along A-A' and C-C' of FIG. 1, of a semiconductor device according to an embodiment.
Figure 21B:
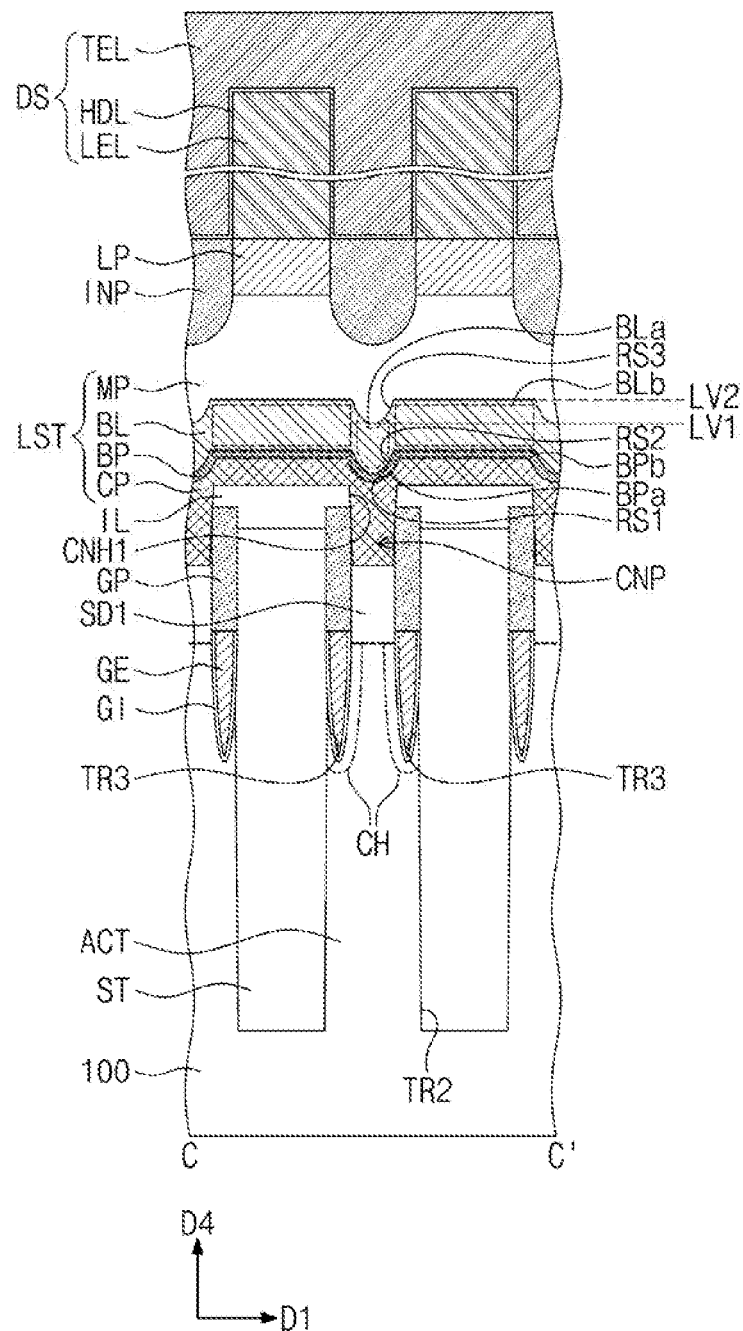

FIGS. 21A and 21B are sectional views, which are respectively taken along A-A' and C-C' of FIG. 1, or a semiconductor device according to an embodiment. For concise description, an element previously described with reference to FIGS. 1 and 2A to 2D may be identified by the same reference number without repeating an overlapping description thereof.

Referring to FIGS. 1, 21A, and 21B, a pad pattern PAD may be on the second source/drain region SD2. The pad pattern PAD may be formed of or include the same material as the conductive pattern CP. In an implementation, the pad pattern PAD may be formed of or include a doped semiconductor material (e.g., doped silicon and doped germanium). The contact CNT may penetrate the insulating layer IL and may be in contact with the pad pattern PAD. A portion of the pad pattern PAD may be recessed. The contact CNT may be in contact with the recessed top surface of the pad pattern PAD.

A portion of the insulating layer IL may be between the pad patterns PAD, which are adjacent to each other in the second direction D2. The portion of the insulating layer IL may extend in a direction toward the device isolation layer ST.

Figure 22A:
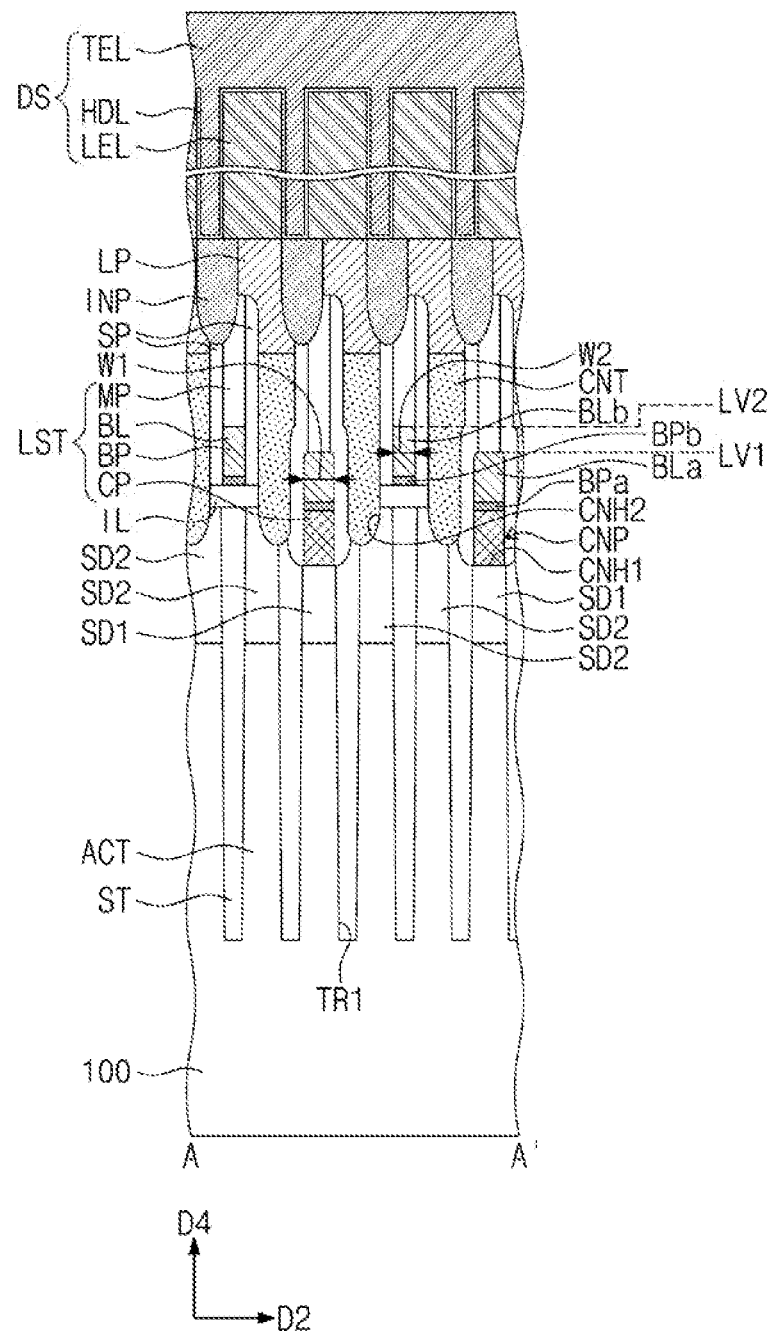
FIGS. 22A, 22B, and 22C are sectional views, which are respectively taken along the lines A-A', B-B', and C-C' of FIG. 1, or a semiconductor device according to an embodiment.
Figure 22B:
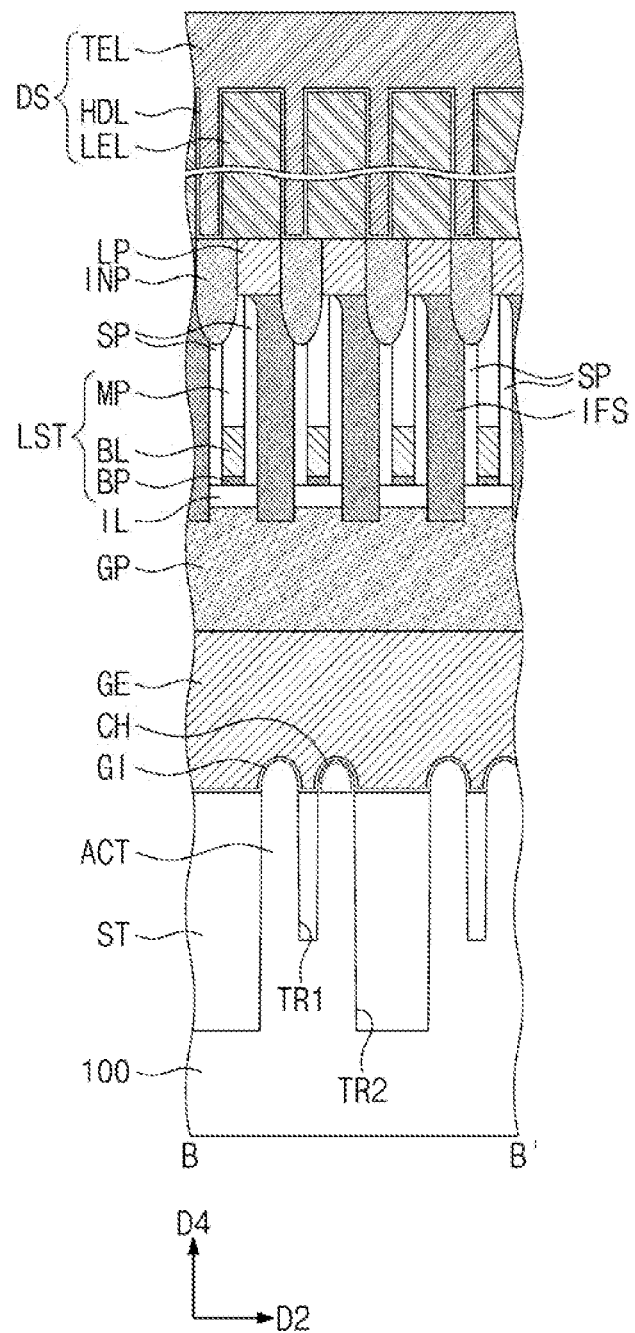
Figure 22C:
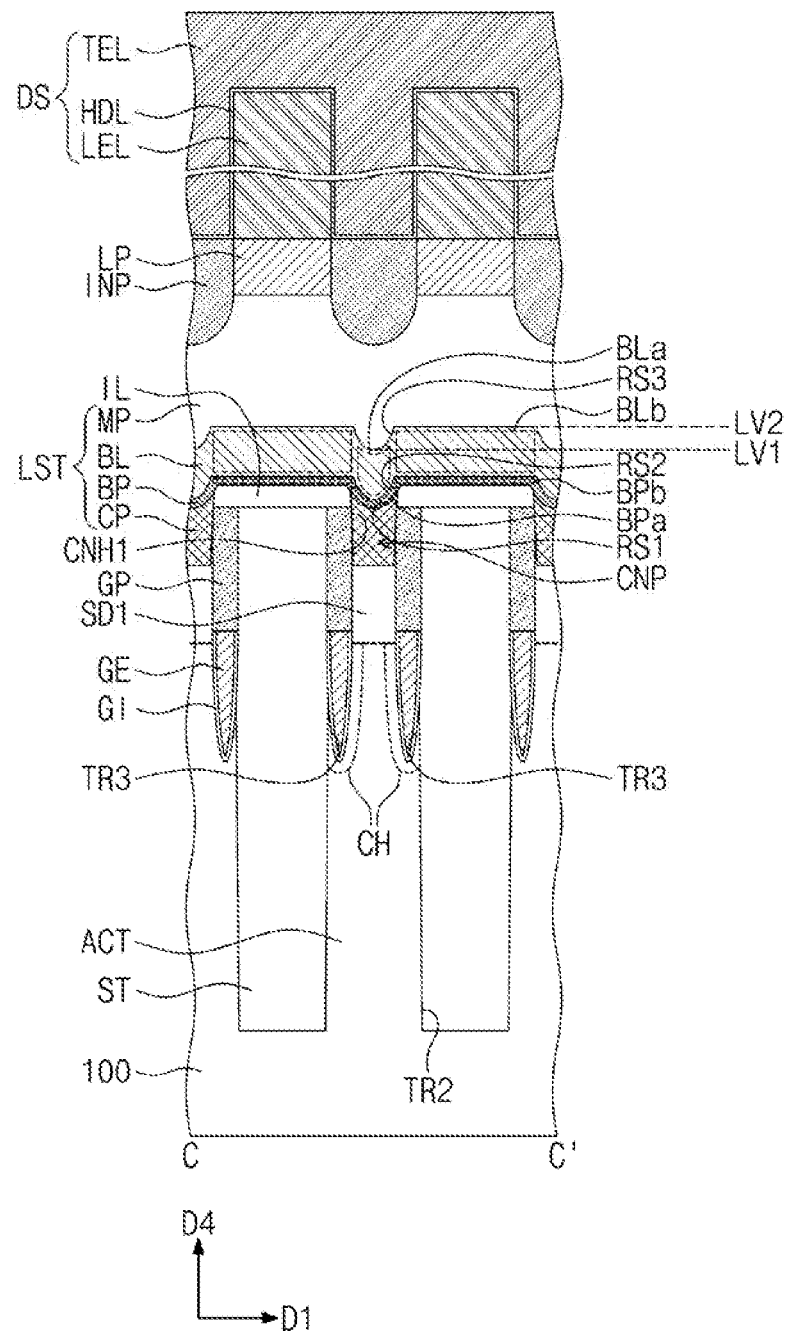

FIGS. 22A, 22B, and 22C are sectional views, which are respectively taken along the lines A-A', B-B', and C-C' of FIG. 1, or a semiconductor device according to an embodiment. For concise description, an element previously described with reference to FIGS. 1 and 2A to 2D may be identified by the same reference number without repeating an overlapping description thereof.

Referring to FIGS. 1 and 22A to 22C, the second portion BPb of the barrier pattern BP may be in contact with the insulating layer IL. The conductive pattern CP may not extend to a region on a top surface of the insulating layer IL. In an implementation, the conductive pattern CP may not be between the insulating layer IL and the second portion BPb of the barrier pattern BP. The conductive pattern CP may be vertically overlapped with the first source/drain region SD1. The conductive pattern CP may be horizontally offset from the insulating layer IL.

By way of summation and review, semiconductor devices with high reliability, high performance, and/or multiple functions have been considered. Complexity and/or integration density of semiconductor devices may be increased.

In a semiconductor memory device according to an embodiment, the lowermost level of a top surface of a first portion of a bit line, which is vertically overlapped with a first source/drain region, may be at a level lower than the lowermost level of a top surface of a second portion of the bit line, which is vertically overlapped with an insulating layer. Accordingly, it may be possible to reduce an etching amount of each of the bit line, a barrier pattern, and a conductive pattern, which are vertically overlapped with the first source/drain region. Thus, it may be possible to prevent a width of a contact portion, which is in contact with the first source/drain region, from being reduced. In addition, due to this difference in level, a distance between the first portion of the bit line and the second portion of the bit line, which are adjacent to each other, may be increased. Thus, a parasitic capacitance between adjacent ones of the bit lines may be reduced. As a result, electric characteristics of a semiconductor memory device may be improved.

One or more embodiments may provide a semiconductor memory device with improved electric characteristics.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor memory device, comprising:
a substrate including an active pattern that includes a first source/drain region and a second source/drain region;
an insulating layer on the substrate;
a line structure on the insulating layer and extending in a first direction to cross the active pattern, the line structure penetrating the insulating layer on the first source/drain region and including a bit line electrically connected to the first source/drain region; and
a contact spaced apart from the line structure and electrically connected to the second source/drain region,
wherein the bit line includes:
a first portion vertically overlapped with the first source/drain region; and
a second portion vertically overlapped with the insulating layer, and
wherein a lowermost level of a top surface of the first portion of the bit line is at a level lower than a lowermost level of a top surface of the second portion of the bit line.

2. The semiconductor memory device as claimed in claim 1, wherein a largest width of the first portion of the bit line is larger than a largest width of the second portion of the bit line.

3. The semiconductor memory device as claimed in claim 1, wherein:
the contact includes:
an upper portion at a level higher than the first portion of the bit line; and
a lower portion in contact with the second source/drain region and at a level lower than the upper portion, and
a width of the upper portion is larger than a width of the lower portion.

4. The semiconductor memory device as claimed in claim 1, wherein the line structure further includes:
a conductive pattern penetrating the insulating layer and coupled to the first source/drain region; and
a barrier pattern between the conductive pattern and the bit line.

5. The semiconductor memory device as claimed in claim 4, wherein:
the barrier pattern includes:
a first portion vertically overlapped with the first source/drain region; and
a second portion vertically overlapped with the insulating layer, and
a lowermost level of a top surface of the first portion of the barrier pattern is at level lower than a lowermost level of a top surface of the second portion of the barrier pattern.

6. The semiconductor memory device as claimed in claim 5, wherein a width of the first portion of the barrier pattern is larger than a width of the second portion of the barrier pattern.

7. The semiconductor memory device as claimed in claim 4, wherein:
the conductive pattern includes a contact portion coupled to the first source/drain region, and
a width of the contact portion is substantially equal to a width of the first portion of the bit line.

8. The semiconductor memory device as claimed in claim 4, wherein the barrier pattern is in contact with the insulating layer.

9. The semiconductor memory device as claimed in claim 1, wherein the bit line penetrates the insulating layer and is in contact with the first source/drain region.

10. The semiconductor memory device as claimed in claim 1, further comprising a pad pattern between the second source/drain region and the insulating layer,
wherein the contact penetrates the insulating layer and is in contact with the pad pattern.

11. A semiconductor memory device, comprising:
a substrate including a first active pattern, the first active pattern including a first source/drain region and a second source/drain region;
a device isolation layer on the substrate and filling a first trench defining the first active pattern;
an insulating layer on the device isolation layer;
a line structure on the insulating layer, crossing the first active pattern, and extending in a first direction, the line structure including:
a conductive pattern penetrating the insulating layer and being coupled to the first source/drain region,
a barrier pattern on the conductive pattern, and
a bit line on the barrier pattern;
a gate electrode extending in a second direction, crossing the first active pattern, and crossing a region between the first and second source/drain regions;
a spacer on a side surface of the line structure; and
a contact spaced apart from the line structure by the spacer and electrically connected to the second source/drain region,
wherein each of the bit line and the barrier pattern includes:
a first portion vertically overlapped with the first source/drain region; and
a second portion vertically overlapped with the insulating layer, and wherein a largest width of the first portion of the bit line is larger than a largest width of the second portion of the bit line.

12. The semiconductor memory device as claimed in claim 11, wherein a width of the first portion of the barrier pattern is larger than a width of the second portion of the barrier pattern.

13. The semiconductor memory device as claimed in claim 11, wherein:
the conductive pattern includes a contact portion coupled to the first source/drain region, and
a width of the contact portion is substantially equal to a width of the first portion of the bit line.

14. The semiconductor memory device as claimed in claim 11, wherein a lowermost level of a top surface of the first portion of the bit line is at a level lower than a lowermost level of a top surface of the second portion of the bit line.

15. The semiconductor memory device as claimed in claim 11, wherein:
the substrate further includes a second active pattern,
each of the first and second active patterns has a long axis in a third direction,
the first and second active patterns are adjacent to each other in the third direction,
the device isolation layer fills a second trench between the first active pattern and the second active pattern, and
the second trench is deeper than the first trench.

16. A semiconductor memory device, comprising:
a substrate including an active pattern having a long axis in a first direction, the active pattern including a first source/drain region and a pair of second source/drain regions, the pair of second source/drain regions being spaced apart from each other in the first direction with the first source/drain region interposed therebetween;
a device isolation layer on the substrate and filling a first trench defining the active pattern;
a pair of gate electrodes extending in a second direction and crossing the active pattern, each gate electrode of the pair of gate electrodes being in a second trench between the first and second source/drain regions;
a gate dielectric layer between each of the pair of gate electrodes and the active pattern;
a gate capping layer on each of the pair of gate electrodes and filling the second trench;
an insulating layer on the substrate;
a line structure on the insulating layer, crossing the active pattern, and extending in a third direction, the line structure including:
a conductive pattern penetrating the insulating layer and being coupled to the first source/drain region,
a bit line on the conductive pattern, and
a barrier pattern between the bit line and the conductive pattern;
a pair of spacers on opposite side surfaces of the line structure, respectively;
contacts respectively coupled to the pair of second source/drain regions and being spaced apart from the line structure by the pair of spacers;
landing pads on the contacts;
first electrodes on the landing pads, respectively;
a second electrode on the first electrodes; and
a dielectric layer between the first electrodes and the second electrode,
wherein the bit line of the line structure includes:
a first portion vertically overlapped with the first source/drain region; and
a second portion vertically overlapped with the insulating layer, and
wherein a lowermost level of a top surface of the first portion of the bit line is at a level lower than a lowermost level of a top surface of the second portion of the bit line.

17. The semiconductor memory device as claimed in claim 1, wherein:
the contact includes:
an upper portion at a level higher than the first portion of the bit line; and
a lower portion in contact with the second source/drain region and at a level lower than the upper portion, and
a width of the upper portion is larger than a width of the lower portion.

18. The semiconductor memory device as claimed in claim 16, wherein a largest width of the first portion of the bit line is larger than a largest width of the second portion of the bit line.

19. The semiconductor memory device as claimed in claim 16, wherein:
the barrier pattern includes:
a first portion vertically overlapped with the first source/drain region; and
a second portion vertically overlapped with the insulating layer, and
a lowermost level of a top surface of the first portion of the barrier pattern is at a level lower than a lowermost level of a top surface of the second portion of the barrier pattern.

20. The semiconductor memory device as claimed in claim 16, wherein the bit line includes molybdenum (Mo) or ruthenium (Ru).

* * * * *